United States Patent
Krabe et al.

(10) Patent No.: US 9,443,835 B2
(45) Date of Patent: Sep. 13, 2016

(54) METHODS FOR PERFORMING EMBEDDED WAFER-LEVEL PACKAGING (EWLP) AND EWLP DEVICES, PACKAGES AND ASSEMBLIES MADE BY THE METHODS

(71) Applicant: Avago Technologies General IP (Singapore) Pte. Ltd., Singapore (SG)

(72) Inventors: Detlef Bernd Krabe, Munich (DE); Martin Weigert, Etterzhausen/Bavaria (DE)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/330,022

(22) Filed: Jul. 14, 2014

(65) Prior Publication Data
US 2015/0262984 A1 Sep. 17, 2015

Related U.S. Application Data

(63) Continuation-in-part of application No. 14/213,342, filed on Mar. 14, 2014.

(51) Int. Cl.
*H01L 21/56* (2006.01)
*H01L 31/0203* (2014.01)
*H01L 25/16* (2006.01)
(Continued)

(52) U.S. Cl.
CPC ........... *H01L 25/167* (2013.01); *H01L 21/568* (2013.01); *H01L 21/76877* (2013.01); *H01L 25/50* (2013.01); *H01L 31/02002* (2013.01); *H01L 31/0203* (2013.01); *H01L 31/12* (2013.01); *H01L 23/3107* (2013.01);
(Continued)

(58) Field of Classification Search
None
See application file for complete search history.

(56) References Cited

U.S. PATENT DOCUMENTS

| 4,711,997 A | 12/1987 | Miller |
| 4,713,841 A | 12/1987 | Porter et al. |

(Continued)

FOREIGN PATENT DOCUMENTS

WO  WO 0002247 A1  7/1999

OTHER PUBLICATIONS

W.R. Bottoms & William T. Chen, "A Description of What Will Specifically Be Needed to Support the Continuation of the Rapid Pace of Progress Achieved by the Electronics Industry," ITRS Chapter: Assembly & Packaging, Future Fab International Issue 40, Jan. 12, 2012,Future Fab International, http://www.future-fab.com.

(Continued)

*Primary Examiner* — Seahvosh Nikmanesh

(57) ABSTRACT

Embedded Wafer-Level Packaging (eWLP) methods and optoelectronic devices, packages and assemblies made by the eWLP methods are described. The eWLP methods allow electrical interconnections to be easily and economically made to the back sides of the chips of the eWLP wafer using eWLP wafer-level processes, thereby eliminating the need to use TMVs or TSVs to make such interconnections. The eWLP methods also allow thermal and optical interconnections between the back side and the front side of the eWLP wafer to be easily and economically made. In addition, the eWLP methods allow electrical and optical interfaces to be formed on the front side and/or on the back side of the eWLP wafer. The eWLP methods may be used to form a variety of very thin optoelectronic devices, packages and assemblies having a various useful configurations with high volume, yield and throughput.

31 Claims, 21 Drawing Sheets

(51) Int. Cl.
*H01L 21/768* (2006.01)
*H01L 31/02* (2006.01)
*H01L 31/12* (2006.01)
*H01L 25/00* (2006.01)
*H01L 23/31* (2006.01)

(52) U.S. Cl.
CPC ........ *H01L23/3121* (2013.01); *H01L 2224/11* (2013.01); *H01L 2224/18* (2013.01)

(56) References Cited

U.S. PATENT DOCUMENTS

| | | |
|---|---|---|
| 5,532,512 A | 7/1996 | Fillion et al. |
| 7,048,450 B2 | 5/2006 | Beer et al. |
| 7,170,049 B2 | 1/2007 | Iwanczyk et al. |
| 7,486,847 B1 | 2/2009 | Dellmann et al. |
| 7,536,066 B2 | 5/2009 | Kato et al. |
| 7,833,480 B2 | 11/2010 | Blazewicz |
| 7,863,088 B2 | 1/2011 | Brunnbauer et al. |
| 8,064,739 B2 | 11/2011 | Binkert et al. |
| 8,352,009 B2 | 1/2013 | Hoarau et al. |
| 8,642,385 B2 | 2/2014 | Xue et al. |
| 8,642,397 B1 | 2/2014 | Gong et al. |
| 8,742,370 B2 | 6/2014 | Tkachuk |
| 2002/0095077 A1 | 7/2002 | Swedlow |
| 2004/0037514 A1 | 2/2004 | Marion |
| 2004/0057648 A1 | 3/2004 | Yunus |
| 2004/0069997 A1 | 4/2004 | Dair et al. |
| 2004/0156597 A1 | 8/2004 | Kaneko |
| 2004/0217366 A1 | 11/2004 | Gale et al. |
| 2004/0223704 A1 | 11/2004 | Fujii |
| 2004/0259282 A1 | 12/2004 | Oohata |
| 2005/0226565 A1 | 10/2005 | Kautio |
| 2006/0045431 A1 | 3/2006 | Boisvert |
| 2008/0122122 A1 | 5/2008 | Wong et al. |
| 2008/0186702 A1 | 8/2008 | Camras et al. |
| 2009/0166857 A1 | 7/2009 | Lee |
| 2010/0061106 A1 | 3/2010 | Shyu et al. |
| 2010/0316184 A1 | 12/2010 | Iwanczyk et al. |
| 2011/0024916 A1 | 2/2011 | Marimuthu et al. |
| 2011/0042798 A1 | 2/2011 | Pagaila et al. |
| 2011/0095426 A1 | 4/2011 | Chang |
| 2011/0193241 A1 | 8/2011 | Yen et al. |
| 2011/0194265 A1 | 8/2011 | Su et al. |
| 2012/0038044 A1 | 2/2012 | Chang et al. |
| 2012/0220082 A1 | 8/2012 | Ng et al. |
| 2013/0001795 A1 | 1/2013 | Lim et al. |
| 2013/0075924 A1 | 3/2013 | Lin et al. |
| 2013/0237774 A1 | 9/2013 | Schentag et al. |
| 2013/0241077 A1 | 9/2013 | Fuergut et al. |
| 2013/0264684 A1 | 10/2013 | Yu et al. |
| 2013/0266255 A1 | 10/2013 | Tan et al. |
| 2013/0320471 A1 | 12/2013 | Luan |
| 2015/0003792 A1 | 1/2015 | Mathai |
| 2015/0118770 A1 | 4/2015 | Krabe et al. |
| 2015/0262983 A1* | 9/2015 | Krabe .................. H01L 25/167 250/214.1 |

OTHER PUBLICATIONS

"Renesas to Commercialize FO-WLP Technology in MCU Product Line by 2011," /-Micronews, Advanced Packaging, Oct. 10, 2010, http://www.renesas.com.
Kitronik Ltd., "Kitronik ltd—5mm RGB LED Common Anode," Technology data Sheet & Specifications, http://www.kitronik.co.uk, 3 pages.
Siliconcore Technology, "SiliconCore LED Display Products," www.silicon-core.com, SiliconCore Technology Inc, Jan. 4, 2013, 53 pages.
Thingm Labs, "Blinkm Datasheet," blinkm.thingm.com, V20100810, Thingm Labs, Pasadena, CA, 50 pages.
eWLB Embedded Wafer-Level Ball Grid Array, Aug. 2011, p. 1-2, STATS chipPAC ltd. Singapore, www.statschippac.com.
Wafer Level Chip Scale Package (WLCSP), Freescale Semiconductor Application Note, Aug. 2009, 16 pages, AN3846, Rev. 2.0.
W.R. Bottoms & William T. Chen, "An Overview of the Innovations, Emerging Technologies and Difficult Challenges Regarding the Assembly & Packaging Chapter of the ITRS," Assembly & Packaging, Jan. 15, 2009, 4 pages, Future Fab International Issue 28, Future Fab International, http://www.future-fab.com.
William Henry, "MicroLEDs Enabling New Generation of Fluorescence Instruments," BioPhotonics, www.photonics.com, 2014, 5 pages.
Artur Dybko, "Fiber Optic Chemical Sensors," Chemical Sensors Research Group, 2005, 9 pages, http://csrg.ch.pw.edu.pl/tutorials/fiber.
Kim, Do-Won et al., "High Efficiency and Stable Optical Transmitter Using VCSEL—direct-bonded Connector for Optical Interconnection," Nov. 13, 2007, 9 pages.
Paniccia, Mario, "The Silicon Solution," Oct. 1, 2005, 8 pages.
Garrou, P., "IFTLE 29 IEEE 3D IC Test Workshop Part 2." Solid State Technnology [online]. Dec. 22, 2010. [retrieved on Jun. 27, 2013], 127 pages. Retrieved from the Internet: <URL: http://www.electroiq.com/blogs/insights_from_leading_edge/2010.html>.
Souriau, J., et al. "Wafer Level Processing of 3D System in Package for RF and Data Applications." IEEE 2005 Electronic Components and Technology Conference. pp. 356-361.

* cited by examiner

METHODS FOR PERFORMING EMBEDDED WAFER-LEVEL PACKAGING (EWLP) AND EWLP DEVICES, PACKAGES AND ASSEMBLIES MADE BY THE METHODS

CROSS-REFERENCE TO RELATED APPLICATIONS

This application is a continuation-in-part application of U.S. application Ser. No. 14/213,342, filed Mar. 14, 2014, entitled "METHODS FOR PERFORMING EXTENDED WAFER-LEVEL PACKAGING (eWLP) AND eWLP DEVICES MADE BY THE METHODS," which is currently pending and which is incorporated herein by reference in its entirety.

TECHNICAL FIELD OF THE INVENTION

The invention relates to embedded Wafer-Level Packaging (eWLP) technology, and more particularly, to eWLP methods and eWLP devices, packages and assemblies made by the methods.

BACKGROUND OF THE INVENTION eWLP technology is a semiconductor device packaging technology in which a multiplicity of device packages having semiconductor dies or chips embedded therein are co-formed with one another as part of a single "wafer" of moldable material and then transformed into individual packages by dicing or singulating the wafer. In addition to semiconductor dies or chips, various types of passive electrical components and optical elements may also be embedded in the wafer. The process of forming eWLP packages commonly begins with mounting a multiplicity of semiconductor dies on an adhesive tape base. A robotic pick-and-place machine is commonly employed in the mounting step. Next, a layer of molding compound, such as a liquid polymer, is applied to the dies and to the adhesive tape base, thereby embedding, or potting, the dies within the molding compound. The molding compound is then cured to harden it. The resulting assembly is analogous to a wafer of the type traditionally employed in semiconductor fabrication in that the assembly is singulated in a later step of the process. For this reason, such an eWLP assembly is sometimes referred to as a wafer.

The tape base is removed from the assembly, exposing the front side of the assembly. The molding compound surface on the back side of the assembly is ground down until the assembly has a target thickness. Next, a metal layer is applied to one or both surfaces of the assembly by, for example, metal sputtering, electro-plating, or both in sequential order. Each metal layer is then photolithographically patterned to form a redistribution layer (RDL) that defines electrical signal paths. In some types of eWLP processes, arrays of solder balls are formed on the RDL. The assembly is then diced into individual eWLP packages, each containing one or more semiconductor chips.

Optoelectronic devices or modules having eWLP packages are known. Optoelectronic modules, such as optical transmitter and receiver modules, for example, are used in optical communications systems and sensor systems. In the case of an optical communications system, an optical transmitter can convert electrical signals that are modulated with information into optical signals for transmission over an optical fiber. An optoelectronic light source, such as a laser diode, performs the electrical-to-optical signal conversion in the optical transmitter. An optical receiver can receive the optical signals transmitted over the optical fiber and recover the information by demodulating the optical signals. An optoelectronic light detector, such as a photodiode, performs the optical-to-electrical signal conversion in the optical receiver. The functions of optoelectronic modules in sensor systems are very similar, with an emitting device (e.g., a laser diode) performing the electrical-to-optical conversion and a receiving device (e.g., a photodiode) performing the optical-to-electrical conversion. Additional integrated circuits (ICs) might be included in the eWLP package for controlling the system or processing data and signals in the system.

The optoelectronic light sources, receivers and/or ICs incorporated into the eWLP packages have front side and/or back side contacts on them. The front side contacts become accessible when the adhesive tape is removed from the front side of the wafer. Any back side contacts, however, are typically encapsulated within the hardened molding compound, and therefore are not easily accessible. One way to access the back side contacts is to form thru-silicon vias (TSVs) or thru-mold vias (TMVs) in the bulk material of the chips or in the mold material, respectively, to create electrical pathways from the front side of the wafer to the back side of the wafer. Electrical connections (e.g., bond wires) may then be used to connect the ends of the vias disposed on the back side of the wafer to electrical contacts disposed on the back sides of the chips. The manner in which such connections are made within the wafer affects manufacturing economy.

Accordingly, it would be desirable to provide eWLP methods that allow back side electrical and/or thermal connections to be easily and economically made.

SUMMARY OF THE INVENTION

The invention is directed to eWLP methods and eWLP devices, packages and assemblies made by the methods. In accordance with illustrative an embodiment, the eWLP method comprises forming an eWLP artificial wafer comprising a plurality of components partially encapsulated within a hard molded compound, forming an electrical interface on either the front side or the back side of the eWLP artificial wafer, and dicing the eWLP wafer into a plurality of eWLP packages. Front sides of the components are outside of the hard molded compound and disposed on a front side of the eWLP artificial wafer. The components include an IC chip of a first type having at least a first electrical contact element disposed on the front side thereof and at least a second electrical contact element disposed on a back side thereof. The second electrical contact element is electrically coupled with a first electrically-conductive back side interconnect element. A portion of the interconnect element is outside of the hard molded compound and disposed on a back side of the eWLP artificial wafer. Each eWLP package that results from the dicing step includes at least one of the IC chips of the first type.

In accordance with an illustrative embodiment, the eWLP assembly comprises an eWLP package diced from an eWLP artificial wafer, an electrical interface on either the front side or the back side of the eWLP package, and a carrier on which the eWLP package is mounted. The eWLP package comprises at least an IC chip of a first type partially encapsulated within a hard molded compound of the eWLP package. The IC chip of the first type has at least a first electrical contact element disposed on a front side thereof and at least a second electrical contact element disposed on a back side thereof.

The second electrical contact element is electrically coupled with a first electrically-conductive back side interconnect element of the eWLP package. A portion of the interconnect element is outside of the hard molded compound and is disposed on a back side of the eWLP package. The first electrical contact element is outside of the hard molded compound and is disposed on a front side of the eWLP package. The carrier has an electrical interface that is interfaced with the electrical interface of the eWLP package.

In accordance with another illustrative embodiment, the eWLP method comprises forming an eWLP artificial wafer having a front side, a back side, and a plurality of interconnect elements extending between the front side and the back side of the eWLP artificial wafer. Each interconnect element has a first end disposed on a front side of the eWLP artificial wafer outside of the wafer and having a second end disposed on a back side of the eWLP artificial wafer outside of the wafer. Each interconnect element comprising a semiconductor material that has been doped to increase an electrical conductivity of the semiconductor material such that the interconnect element acts as an electrical interconnect between the front side of the eWLP artificial wafer and the back side of the eWLP artificial wafer.

These and other features and advantages of the invention will become apparent from the following description, drawings and claims.

DETAILED DESCRIPTION OF AN ILLUSTRATIVE EMBODIMENT

Figure 1A:
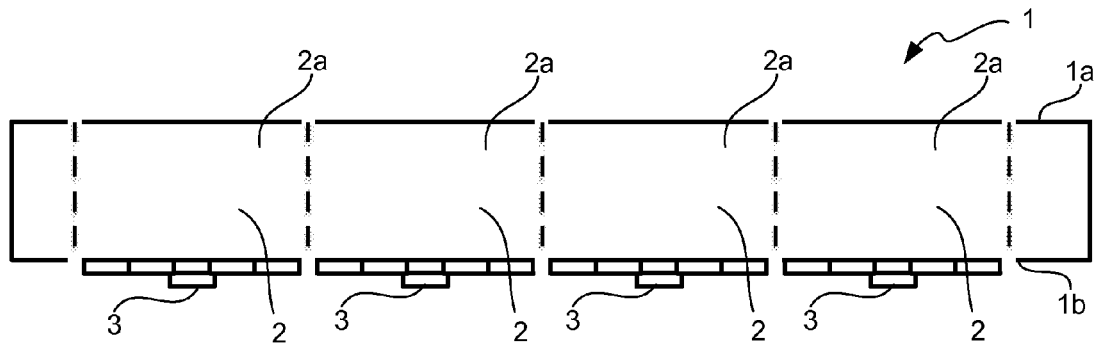
FIG. 1A illustrates a side cross-sectional view of a semiconductor wafer having a plurality of optoelectronic chips formed therein.

In accordance with illustrative embodiments described herein, eWLP methods, devices, packages and assemblies are provided. The eWLP methods allow electrical interconnections to be easily and economically made to the back sides of the chips at the eWLP wafer level without having to use TMVs or TSVs to make such interconnections. The eWLP methods also allow thermal and optical interconnections between the back side and the front side of the eWLP wafer to be easily and economically made. In addition, the eWLP methods allow electrical and optical interfaces to be formed on the front side and/or on the back side of the eWLP wafer. The eWLP methods eliminate the need for bond wires for making back side electrical interconnections and eliminate the need for housings for the optoelectronic devices, packages and assemblies, which enables a variety of very thin optoelectronic devices, packages and assemblies having a various useful configurations to be made with high volume, high yield and high throughput.

Surface mount technology (SMT) has been the predominant technology used to make small and flat optoelectronic packages and assemblies. SMT generally includes the processes of die attaching chips to a leadframe or PCB, wire bonding the electrical contacts of the chips to a leadframe and/or to a PCB, and using over-molding, pre-molding and/or casting techniques to create a housing or encapsulation for the package or assembly. With demands in the industry for further size reductions, further increases in functionality, and further improvements in operational accuracy, the standard SMT assembly process is reaching its limits. The eWLP methods of the present invention enable all of these industry goals to be achieved with high volume, high yield and high throughput.

Illustrative embodiments of the eWLP methods will first be described with reference to FIGS. 1A-4I, and then a variety of eWLP optoelectronic devices, packages and assemblies that may be made by the eWLP methods will be described with reference to FIGS. 6-11. Like reference numerals in the figures represent like elements, features or components. Elements, features or components in the figures are not drawn to scale and are not intended to be dimensionally accurate.

Figure 1B:
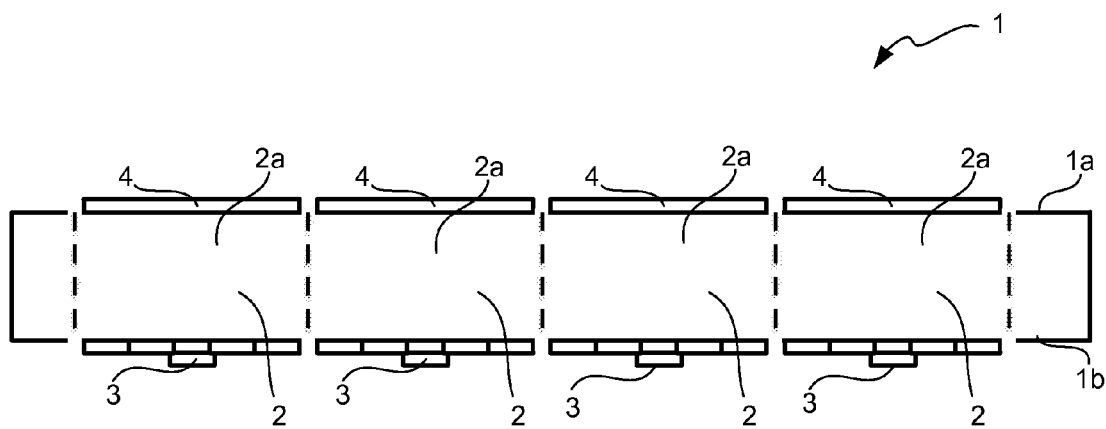
FIG. 1B illustrates a side cross-sectional view of the wafer shown in FIG. 1A after a metallization layer has been applied to the front side of the wafer.
Figure 1C:
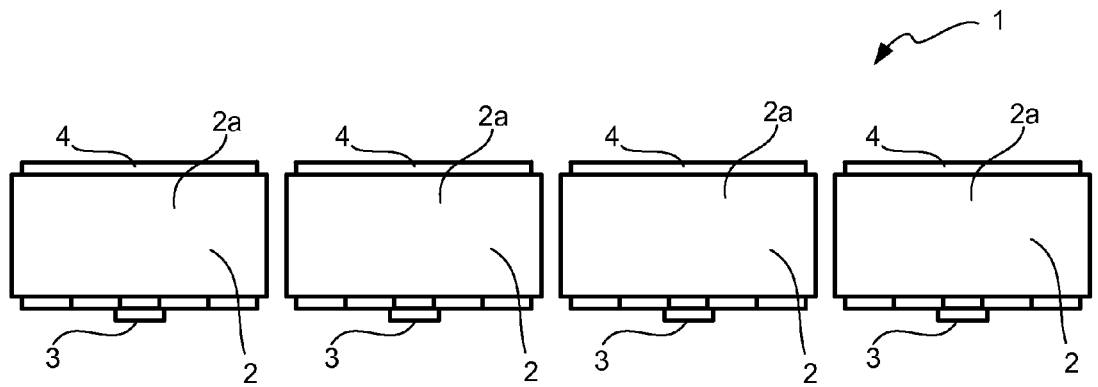
FIG. 1C illustrates a side cross-sectional view of the wafer shown in FIG. 1B after the wafer has been diced, or singulated, to separate the chips from one another.

FIG. 1A illustrates a side cross-sectional view of a semiconductor wafer 1 having a plurality of optoelectronic chips 2 formed therein. FIG. 1B illustrates a side cross-sectional view of the wafer 1 shown in FIG. 1A after a metallization layer 4 has been applied to the front side of the wafer 1 such that the metallization layer 4 covers the front sides of the chips 2. FIG. 1C illustrates a side cross-sectional view of the wafer 1 shown in FIG. 1B after the wafer 1 has been diced, or singulated, to separate the chips 2 from one another.

The wafer 1 has a front side 1a and a back side 1b. A plurality of electrically-conductive functional structures 3 are formed on the front side 1a of the wafer 1 during known semiconductor wafer processes. The functional structures 3 may be any type of structures, but are typically electrical contacts for providing electrical pathways to electrical contact pads (not shown) formed in the respective chips 2. Each chip 2 has a bulk 2a, which is the primary material of which the chip 2 is made. The bulk 2a may be made of any type of material, such as a semiconductive material, a conductive material, an insulative material, or any combination thereof.

Although the wafer 1 shown in FIG. 1A is referred to herein as a semiconductor wafer, this terminology is intended to denote that the wafer 1 is formed using known semiconductor, or microelectronic, fabrication processes rather than to denote the type of bulk material of which the wafer 1 is made. In accordance with this illustrative embodiment, a metallization layer 4 is formed on the front side 1a of the wafer 1 by known wafer-level processes, e.g., sputtering, vapor deposition, etc. The metallization layer 4 is not needed in all cases, as will be described below in more detail.

FIG. 1B illustrates a side cross-sectional view of the wafer 1 shown in FIG. 1A after a metallization layer 4 has been applied to the front side of the wafer 1 such that the metallization layer 4 covers the front sides of the chips 2.

FIG. 1C illustrates a side cross-sectional view of the wafer 1 shown in FIG. 1B after the wafer 1 has been diced, or singulated, to separate the chips 2 from one another. After the chips 2 have been singulated from one another, the chips 2 are used in combination with other components to form an artificial wafer, as will now be described with reference to FIGS. 2A-2N.

Figure 2A:
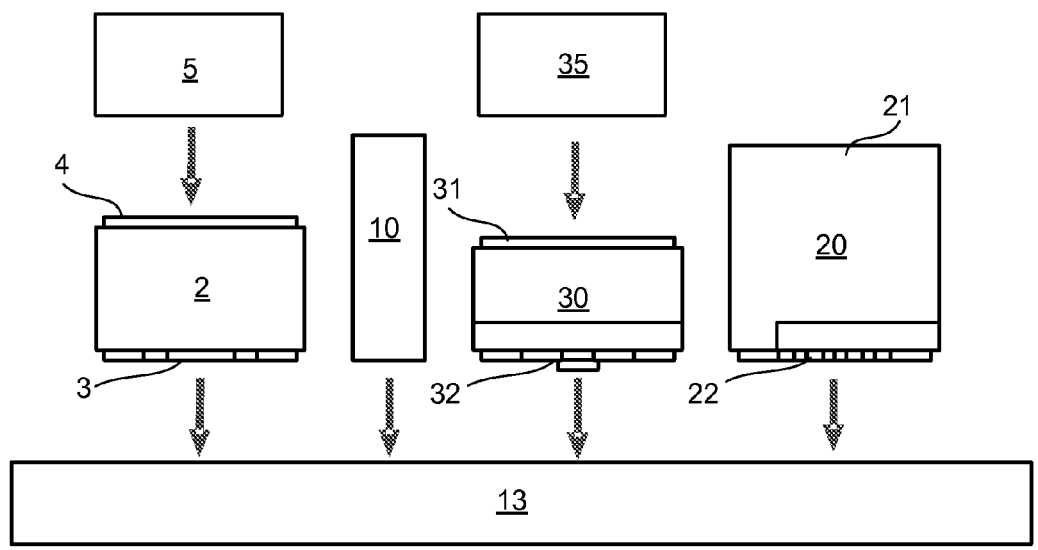
FIG. 2A illustrates a cross-sectional view of one of the chips shown in FIGS. 1A-1C, two other chips, and a block of electrically-conductive bulk material as they are all being mounted on an adhesive tape base.

A known pick-and-place machine (not shown) and process are used to place one or more of the chips 2 shown in FIGS. 1A-1C, one or more other chips 20 and 30, and various other components including a block of bulk material 10 at precise locations on an adhesive tape base 13. FIG. 2A illustrates a cross-sectional view of one of the chips 2 shown in FIGS. 1A-1C, two other chips 20 and 30, and a block of bulk material 10 as they are all being mounted on an adhesive tape base 13. The adhesive tape base 13 forms the base of the artificial wafer. In accordance with this embodiment, the chips 20 and 30 are different types of chips that have been formed on respective semiconductor wafers (not shown) and singulated therefrom using semiconductor wafer processes similar to those described above with reference to FIGS. 1A-1C. Chips 20 and 30 are also different in type from chip 2. The block of bulk material 10 may be obtained by singulating a wafer (not shown) of the bulk material into individual blocks of bulk material 10.

In accordance with this illustrative embodiment, chip 30 has a metallization layer 31 that has previously been formed on the back side thereof by a known wafer-level metallization process in the same manner in which the metallization layer 4 is formed on the chips 2. A plurality of electrically-conductive functional structures 22 and 32 were previously formed on the front side of the chips 20 and 30, respectively, by one or more known wafer-level processes prior to the chips 20 and 30 being mounted on the tape base 13. The functional structures 22 and 32 may be any type of structures, but are typically electrical contacts that provide electrical pathways from the front sides of the chips to electrical circuitry (not shown) located inside of the chips 20 and 30.

Figure 2B:
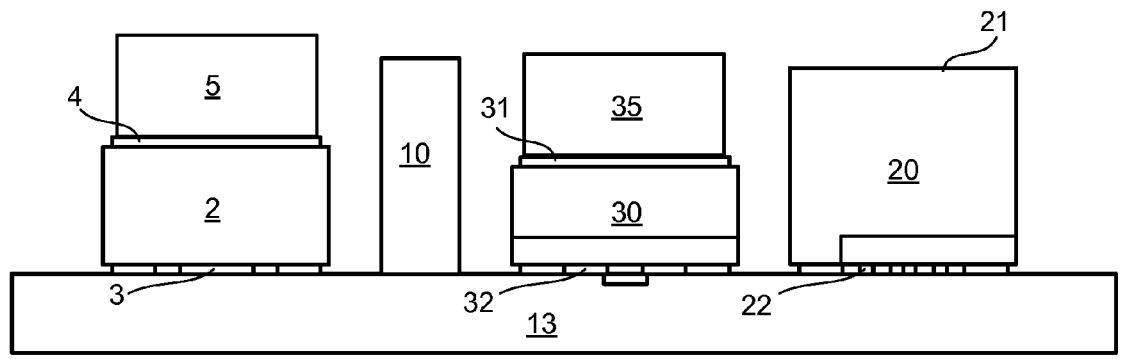
FIG. 2B illustrates a cross-sectional view of the chips and the block of bulk material shown in FIG. 2A after they have been mounted on the adhesive tape base.

FIG. 2B illustrates a cross-sectional view of the chips 2, 20 and 30 and the block of bulk material 10 after they have been mounted on the adhesive tape base 13 by the pick-and-place machine. After the chips 2, 20 and 30 and the block of bulk material 10 have been placed on the tape base 13 by the pick-and-place machine, respective back side interconnect elements 5 and 35 are placed by the pick-andplace machine on the metallization layers 4 and 31 of the chips 2 and 30, respectively. The interconnect elements 5 and 35 may comprise any type of electrically-conductive or electrically-semiconductive material, but typically comprise an electrically-semiconductive material such as silicon that has been doped with an n-type material such as phosphorus, for example, to make it highly electrically conductive. Silicon is a material that is compatible with wafer-level microelectronic chip fabrication processes, which makes it very suitable for use with the other wafer-level processes being described herein. For these reasons, n-doped silicon blocks are typically used for the back side interconnect elements 5 and 35. For illustrative purposes, it will be assumed that the back side interconnect elements 5 and 35 are silicon blocks, although it will be understood that the invention is not limited to using silicon blocks for this purpose. For example, the interconnect elements 5 and 35 could instead be, for example, solder bumps.

In accordance with an illustrative embodiment, the silicon blocks 5 and 35 are diced from respective n-doped silicon wafers prior to the pick-and-place process being performed. Prior to attaching the blocks 5 and 35 to the metallization layers 4 and 31, respectively, the lower surfaces of the blocks 5 and 35 are dipped in an adhesive material (not shown). The step of dipping the blocks 5 and 35 in the adhesive material typically occurs during the pick-and-place process. After the blocks 5 and 35 have been dipped in the adhesive material, they are placed on the metallization layers 4 and 31 by the pick-and-place machine, as shown in FIG. 2B. The process of curing the adhesive material may be accomplished in different ways. As one example, the epoxy may be cured thermally after the blocks 5 and 35 have been placed on the metallization layers 4 and 31, respectively. As another example, the curing process may be pre-initiated by exposing it to ultraviolet light just prior to placing the blocks 5 and 35 on the metallization layers 4 and 31, respectively. As another example, these two curing processes may be combined.

In accordance with an illustrative embodiment, chip 20 is made of a bulk material such as n-doped silicon that makes the bulk material of the chip 20 highly conductive. For this reason, chip 20 does not have a metallization layer or a back side interconnect element.

Figure 2C:
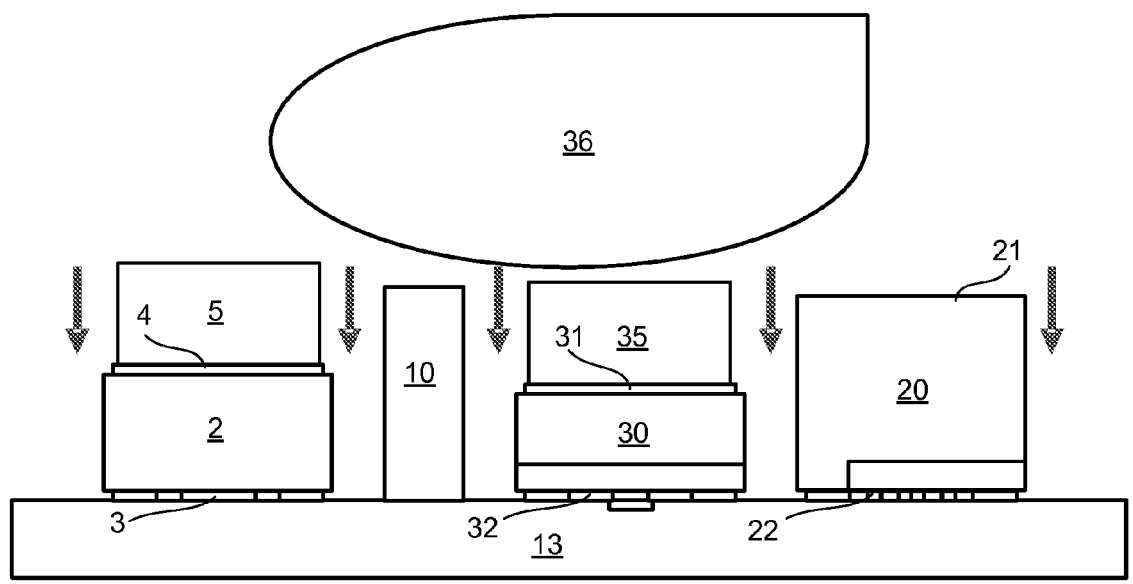
FIG. 2C illustrates a cross-sectional view of the chips and the block of bulk material mounted on the adhesive tape base as shown in FIG. 2B as a mold compound is being poured over the tape base, the chips and the block of bulk material.
Figure 2D:
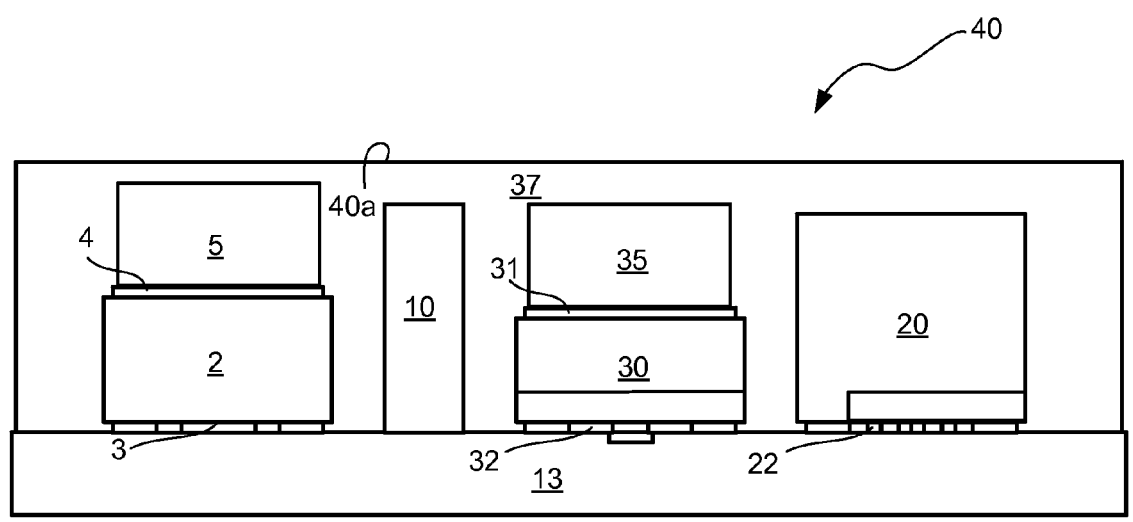
FIG. 2D illustrates a cross-sectional view of the chips and the block of bulk material shown in FIG. 2C encapsulated in the cured mold material forming an artificial eWLP wafer.

FIG. 2C illustrates a cross-sectional view of the chips 2, 20 and 30, and the block of bulk material 10 mounted on the adhesive tape base 13 as a mold compound 36 is being poured over the tape base 13, the chips 2, 20, 30 and the block of bulk material 10. The mold compound 36 is poured into a mold (not shown) and cured to cause it to harden. FIG. 2D illustrates a cross-sectional view of the chips 2, 20 and 30 and the block of bulk material 10 encapsulated in the cured mold material 37, which is in contact with portions of the adhesive tape base 13 in between the areas where the chips 2, 20, 30 and the block of bulk material 10 are in contact with the adhesive tape base 13. The configuration shown in FIG. 2D represents the eWLP artificial wafer 40 in accordance with an illustrative embodiment.

Figure 2E:
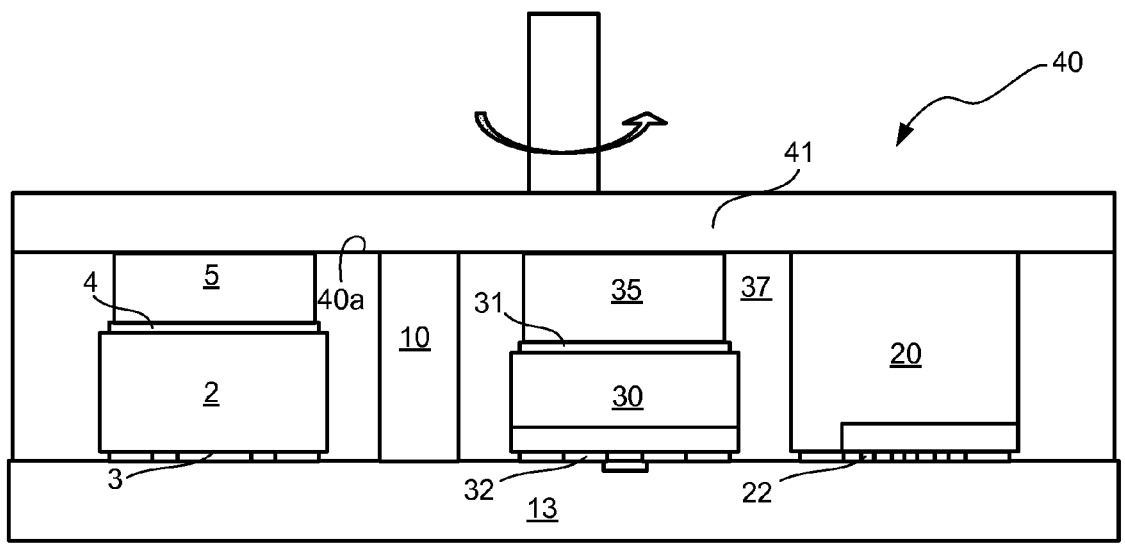
FIG. 2E illustrates a cross-sectional view of the artificial eWLP wafer shown in FIG. 2D being subjected to a downgrinding process.
Figure 2F:
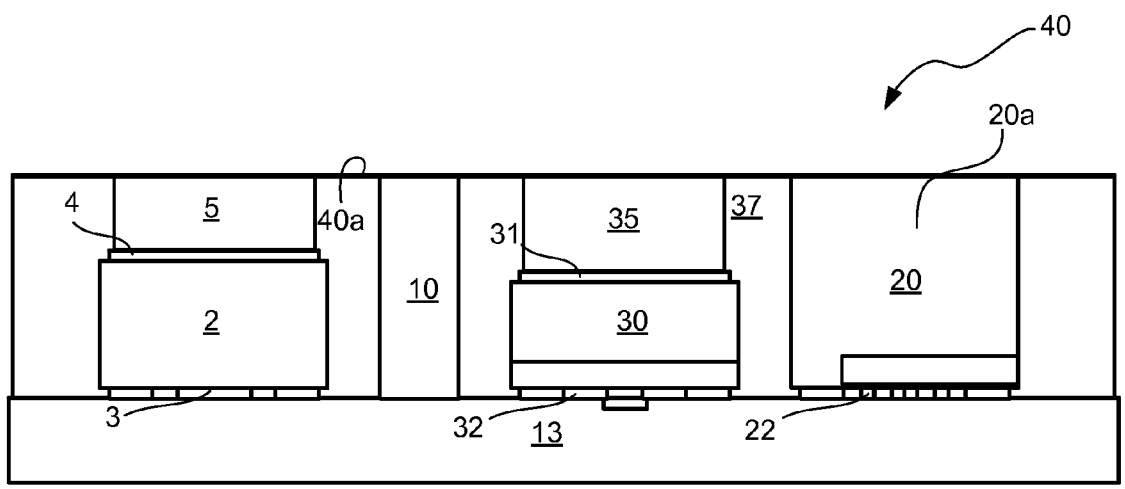
FIG. 2F illustrates a cross-sectional view of the artificial eWLP wafer shown in FIG. 2E after it has been ground down to expose portions of back side interconnect elements, the interior of the bulk material block and the bulk material of one of the chips.

FIG. 2E illustrates a cross-sectional view of the artificial wafer 40 being subjected to the down-grinding process. After the eWLP artificial wafer 40 has been formed, a down-grinding device 41 is used to perform a down-grinding operation that grinds down the top surface 40a of the artificial wafer 40 until the wafer 40 has a particular, or desired, thickness. The manner in which such down-grinding operations are performed to thin wafers to a desired thickness is well known. In accordance with this illustrative embodiment, the artificial wafer 40 is ground down to expose portions of the interconnect elements 5, 35 the interior of the bulk material block 10 and the bulk material of the chip 20. FIG. 2F illustrates a cross-sectional view of the artificial wafer 40 after it has been ground down to expose portions of the interconnect elements 5, 35, the interior of the bulk material block 10 and the interior of the bulk material of chip 20.

As will be described below in more detail, in accordance with this illustrative embodiment, the block of bulk material 10 and the bulk material of chip 20 will be used to provide electrically-conductive pathways from the front side of the eWLP wafer 40 to the back side of the eWLP wafer 40. In the bulk material of chip 20, p-type or n-type wells (not shown) electrically isolate the functional structures 22 of chip 20 from any back side electrical contact of chip 20, in cases where the chip 20 includes a back side electrical contact.

The interconnect elements 5, 35 are used to provide electrically-conductive pathways from the back side of the eWLP wafer 40 to the metallization layers 4 and 31, respectively. Providing all of these electrically-conductive pathways eliminates the need to form TMVs or TSVs in the mold material 37 or in the chips 2, 20 and 30 in order to provide electrically-conductive pathways from the front side to the back side of the eWLP wafer. Also, by forming these electrically-conductive pathways between the front side and the back side of the wafer 40, other process such as galvanic growth processes and electroplating processes that are sometimes used to provide electrically-conductive contact areas on the back side of an eWLP wafer are avoided. Such processes typically use copper or nickel as the electrically-conductive material. Grinding down copper or nickel produces copper or nickel particles that contaminate the eWLP wafer fabrication process. By avoiding the use of such processes and materials, the back side electrical connections are made safely and economically at the eWLP wafer-level without risking contamination of the eWLP wafer fabrication process.

Figure 2G:
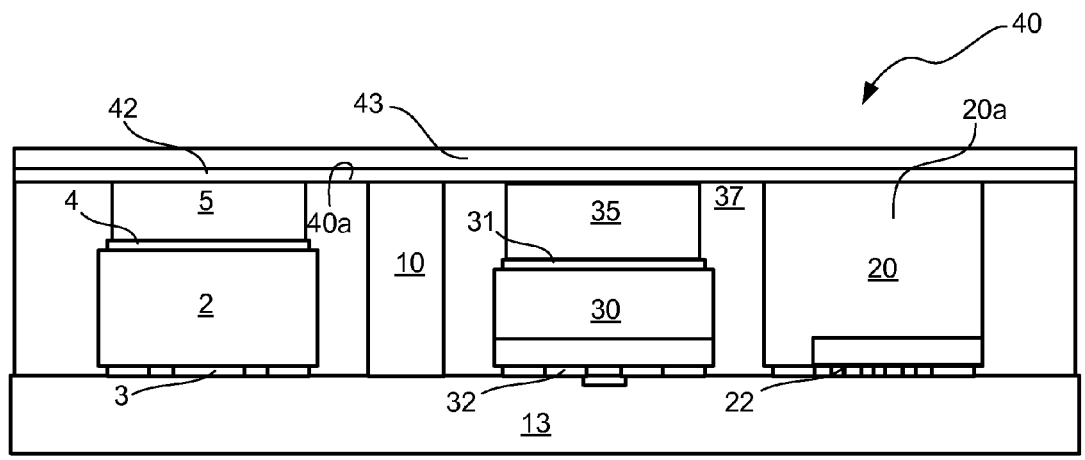
FIG. 2G illustrates a cross-sectional view of the artificial wafer shown in FIG. 2F after a metal layer and a dielectric material layer have been deposited on a back side of the artificial eWLP wafer.
Figure 2H:
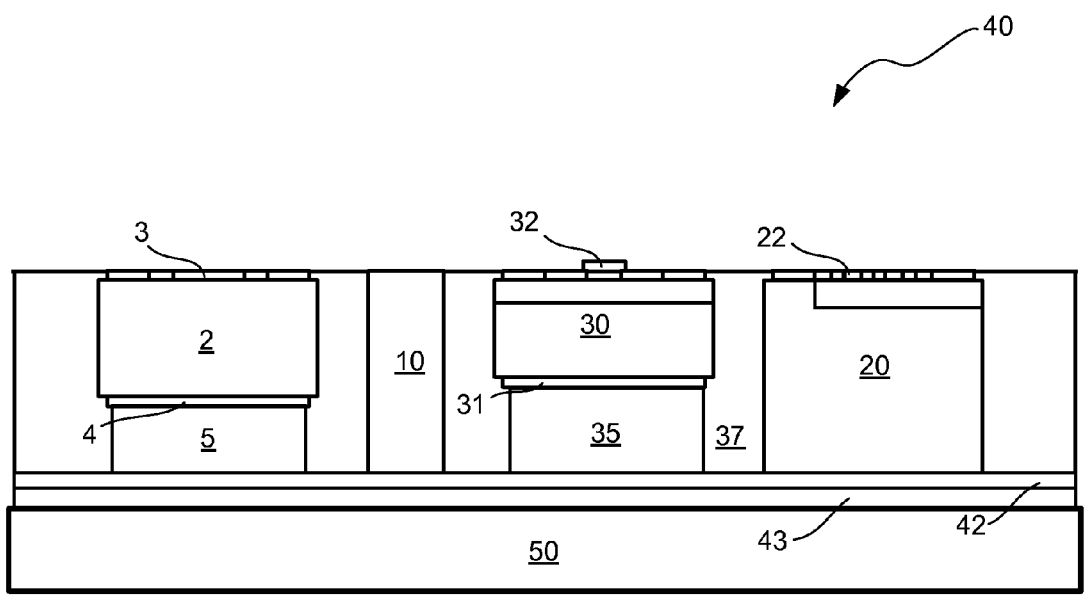
FIG. 2H illustrates a cross-sectional view of the artificial eWLP wafer shown in FIG. 2G after the adhesive tape base has been removed and the wafer has been flipped and mounted on a second adhesive tape base.

FIG. 2G illustrates a cross-sectional view of the artificial wafer 40 being subjected to a metal deposition process. By the metal deposition process, a metal layer 42 is formed on the top surface 40a of the eWLP wafer 40. The metal layer 42 is in contact with the interconnect elements 5, 35, with the block of bulk material 10 and with the bulk material of the chip 20. After formation of the metal layer 42, a layer of dielectric material 43 is deposited over the metal layer 42. The adhesive tape base 13 is then removed. FIG. 2H illustrates a cross-sectional view of the eWLP wafer 40 shown in FIG. 2G after the adhesive tape base 13 has been removed, and the wafer 40 has been flipped and mounted on a second adhesive tape base 50 such that the dielectric material layer 43 is in contact with the adhesive tape base 50. In other words, the back side of the wafer 40 is now in contact with the adhesive tape base 50 and the front side is exposed.

Figure 2I:
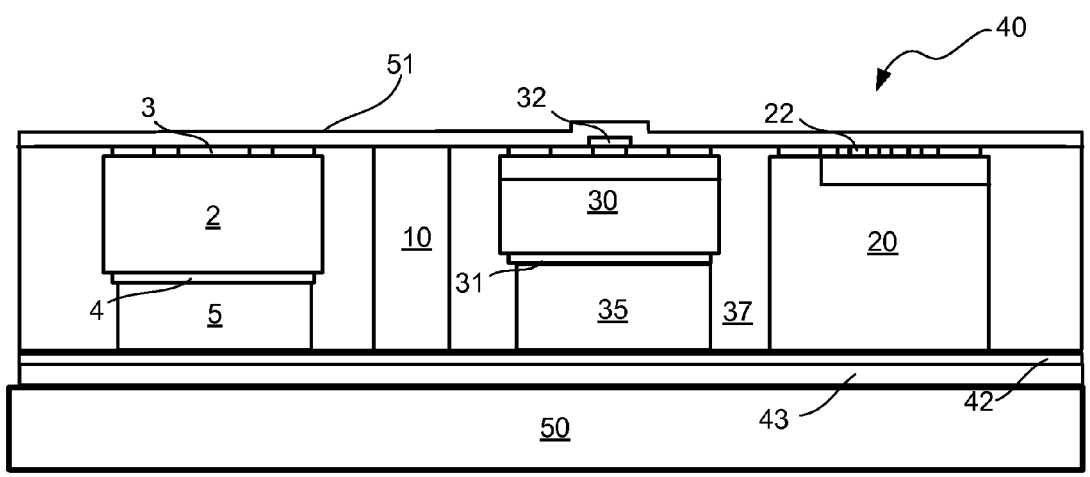
FIG. 2I illustrates a cross-sectional view of the eWLP wafer shown in FIG. 2H after the front side of the wafer has been subjected to a metal deposition process to form a metal layer on the front side of the wafer.
Figure 2J:
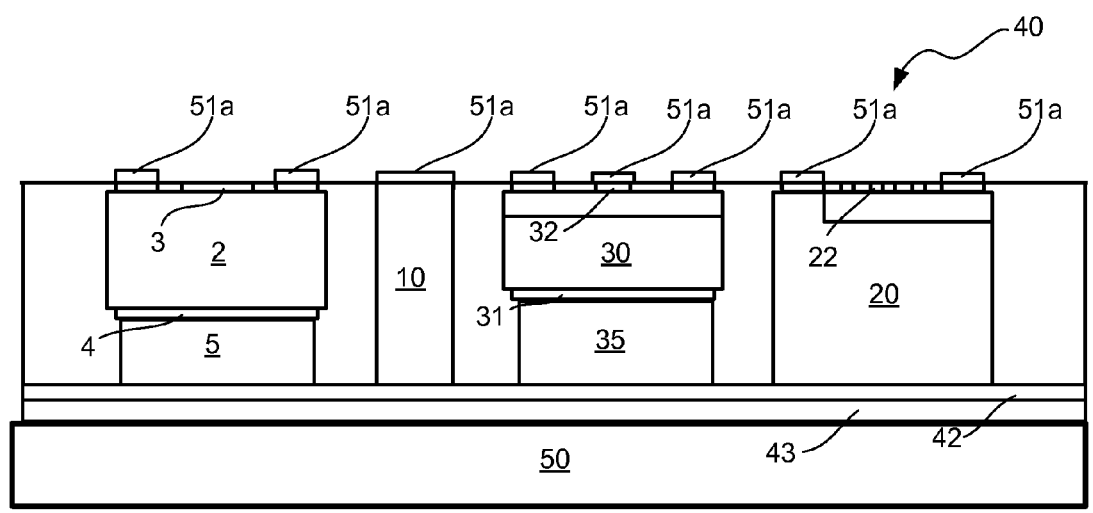
FIG. 2J illustrates a cross-sectional view of the eWLP wafer shown in FIG. 2I with the portions of the metal layer remaining after structuring disposed on the functional structures of the chips.
Figure 2K:
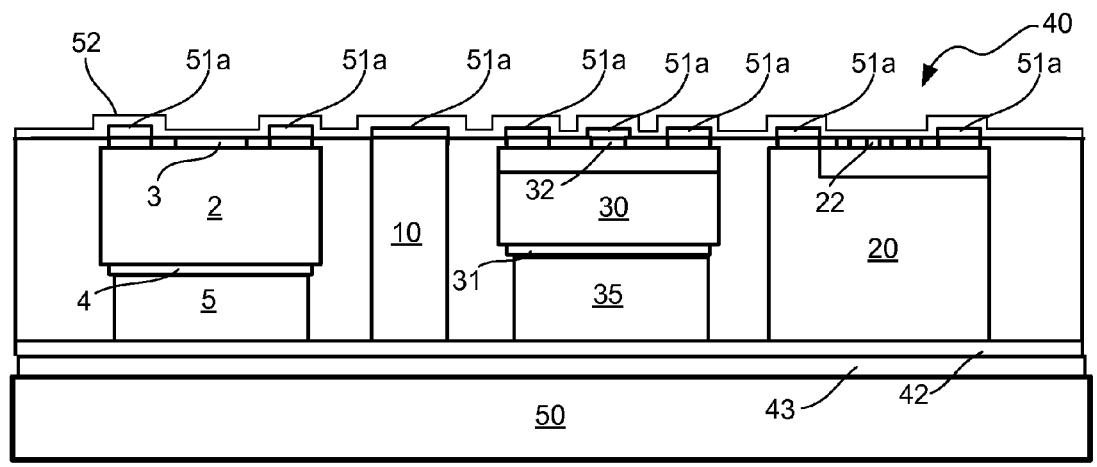
FIG. 2K illustrates a cross-sectional view of the eWLP wafer shown in FIG. 2J with the structured metal layer covered with a layer of dielectric material.
Figure 2L:
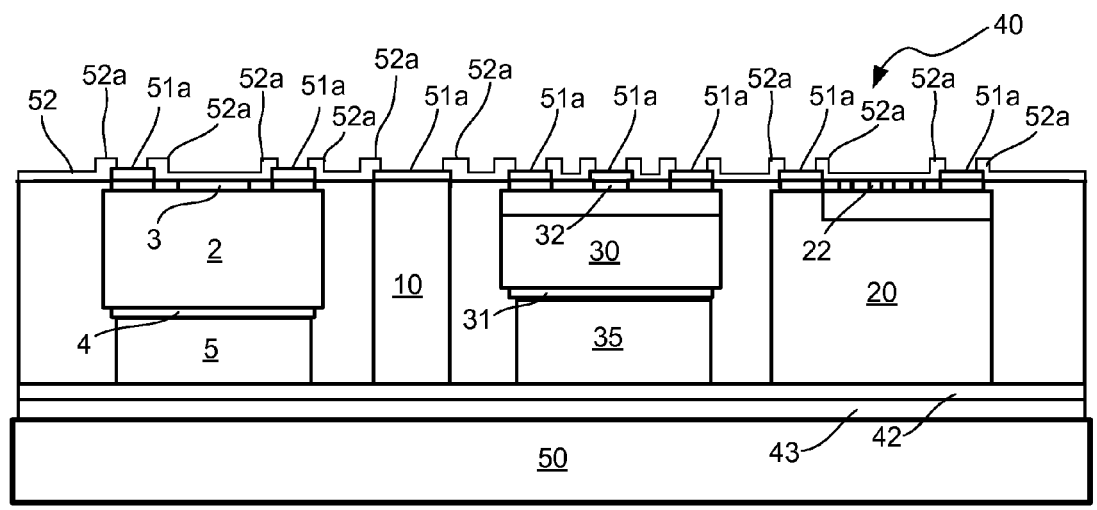
FIG. 2L illustrates a cross-sectional view of the eWLP wafer shown in FIG. 2K after the dielectric layer has been structured, or patterned, to form patterned dielectric layer.

FIG. 2I illustrates a cross-sectional view of the eWLP wafer 40 shown in FIG. 2H after the front side of the wafer 40 has been subjected to a metal deposition process to form a metal layer 51 on the front side of the wafer 40. The metal layer 51 covers the electrically-conductive functional structures 3, 22 and 32. After the metal layer 51 has been put down, it is structured, or patterned, using known metal structuring processes (e.g., masking and etching). FIG. 2J illustrates a cross-sectional view of the eWLP wafer 40 shown in FIG. 2I with the remaining portions 51a after structuring of the metal layer 51 disposed on the functional structures 3, 22 and 32. FIG. 2K illustrates a cross-sectional view of the eWLP wafer 40 shown in FIG. 2J with the structured metal layer 51a covered with a layer of dielectric material 52. FIG. 2L illustrates a cross-sectional view of the eWLP wafer 40 shown in FIG. 2K after the dielectric layer 52 has been structured, or patterned, to form patterned dielectric layer 52a. Known photolithographic processes are used to pattern the dielectric layer 52. The patterned dielectric layer 52a provides dielectric features that insulate the metal portions 51a from adjacent metal portions 51a.

Figure 2M:
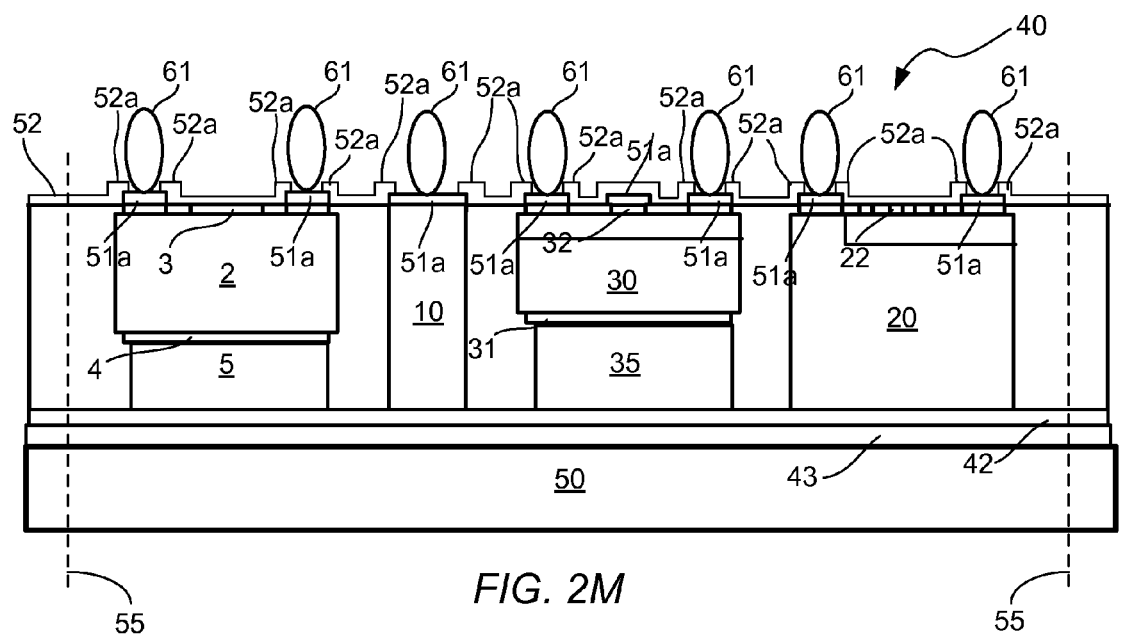
FIG. 2M illustrates a cross-sectional view of the eWLP wafer shown in FIG. 2L after contact elements have been placed on portions of the structured metal layer.
Figure 2N:
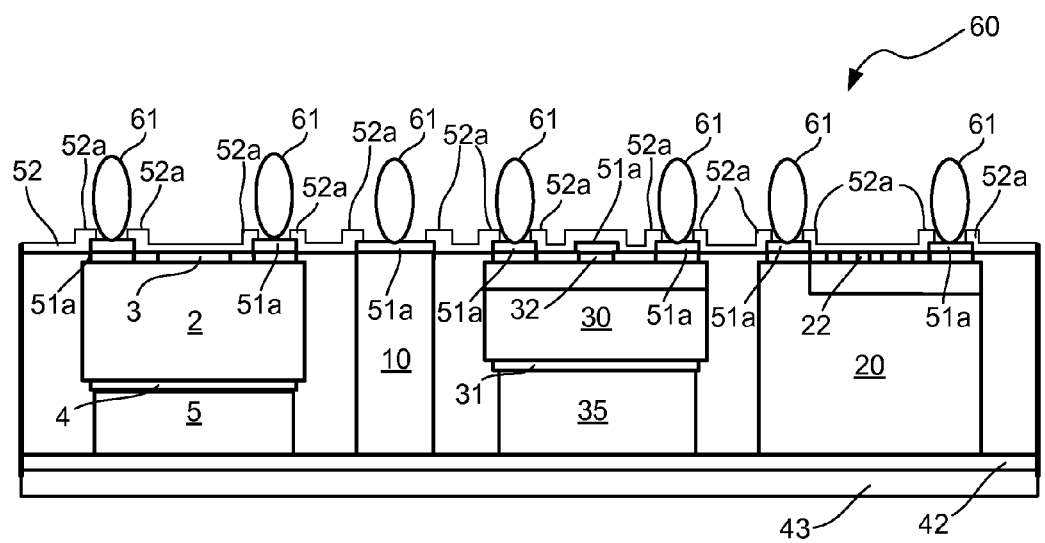
FIG. 2N illustrates a cross-sectional view of the singulated eWLP package that results from performing a dicing operation on the eWLP wafer shown in FIG. 2M.

After the dielectric layer 52 has been patterned, as shown in FIG. 2L, electrically-conductive contact elements 61 are placed on the metal portions 51a of metal layer 51, as shown in FIG. 2M, which illustrates a cross-sectional view of the eWLP wafer 40 shown in FIG. 2L after the contact elements 61 have been placed on the portions 51a of the metal layer 51. After the eWLP wafer 40 has been fabricated by the process described above with reference to FIGS. 2A-2L, a singulation process is performed to singulate the eWLP package shown in FIG. 2M from the other eWLP packages formed in the same wafer 40. Although only one package is shown in FIG. 2M, there will typically be many such packages formed in a single eWLP wafer. The dashed lines 55 in FIG. 2M represent the dicing locations at which the wafer 40 is sawed. FIG. 2N illustrates a cross-sectional view of the singulated eWLP package 60 that results from performing the dicing operation represented by the dashed lines 55. After the dicing operation has been performed, the second adhesive tape base 50 is removed, resulting in the finished eWLP package 60 shown in FIG. 2N. Although the package 60 shown in FIG. 2N may considered finished, or completed, further processing of the package 60 may occur if further processing is needed or desired to add additional features, components or elements.

Figure 3:
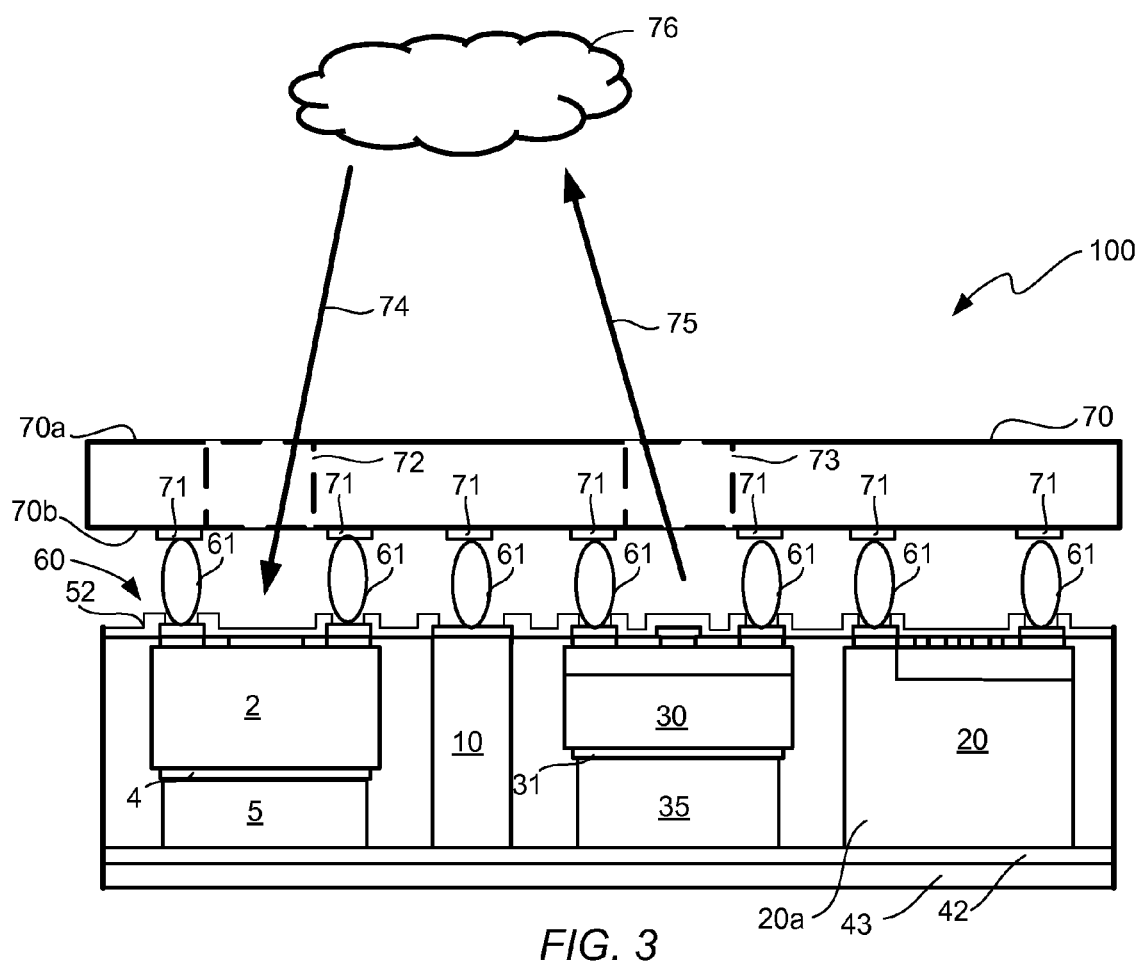
FIG. 3 illustrates a cross-sectional view of an eWLP assembly comprising the eWLP package shown in FIG. 2N electrically connected to a PCB.

FIG. 3 illustrates a cross-sectional view of an eWLP assembly 100 comprising the eWLP package 60 shown in FIG. 2N electrically connected to a PCB 70. The eWLP package 60 is electrically connected to the PCB 70 via the contact elements 61 of the package 60 being placed in contact with respective electrically-conductive contact elements 71 of the PCB 70. Other mechanisms (not shown) may be used to mechanically couple the PCB 70 with the package 60 and to provide mechanical stability for the assembly 100. Optical windows 72 and 73 formed in the PCB 70 extend from a top side 70a of the PCB 70 to a bottom side 70b of the PCB 70. The PCB 70 is only one type of carrier that is suitable for use with the eWLP package 60. The eWLP package 60 could be mounted on and interfaced with other types of carriers. For example, a substrate that is transparent to the light 74 and 75 could be used instead of the PCB 70, in which case there would be no need to form optical windows 72 and 73 in the carrier. For example, the carrier could be a glass substrate having electrical conductors (e.g., wires or traces) disposed therein and electrical contact pads disposed on a surface thereof. Such a carrier could also have optical elements (e.g., reflective elements, refractive elements and/or diffractive elements) formed therein for controlling the direction of propagation of light within the carrier and directing light between the carrier and the eWLP package 60.

In accordance with this illustrative embodiment, the chip 2 is an optoelectronic receiver chip, such as, for example, a photodiode chip, and the chip 30 is an optoelectronic transmitter chip, such as, for example, a light emitting diode (LED) or laser diode chip. Thus, in accordance with this illustrative embodiment, the arrow 74 represents light passing through the window 72 and impinging on a light-receiving area of the chip 2 and the arrow 75 represents light emitted from the chip 30 and passing through the window 73. Thus, the windows 72 and 73 are transparent to operating wavelengths of the chips 2 and 30, respectively. The chip 20 may be, for example, a receiver chip for processing electrical sense signals produced by the chip 2, a laser diode driver chip for producing electrical drive signals that drive the chip 30, or a combination of the two. In accordance with an illustrative embodiment, the chip 2 is a receiver chip, a driver chip, and a processor chip, and chip 30 is a transmitter or emitter chip, in which case chip 20 can be eliminated from the eWLP assembly 100 because its functions are performed by chip 2.

In accordance with an illustrative embodiment, chip 30 emits the same wavelength of light that is detected by chip 2 and at least one of the chips 2, 20 and 30 is a processor chip having processing circuitry (not shown) that processes the electrical sense signals produced by chip 2 to determine the proximity, distance and/or a gesture of a reflective object 76 relative to the eWLP assembly 100. The term "proximity," as that term is used herein, denotes a change in the distance of the object 76 relative to the eWLP assembly 100. The object 76 may be any reflective object. An example of a reflective object 76 is a part of the user's body, such as, for example, a hand, a finger, a face, or an ear. The eWLP assembly 100 may be incorporated into a mobile device, such as, for example, a mobile phone, although the invention is not limited with respect to the types of devices or systems in which the eWLP packages and assemblies of the invention are used.

If the eWLP assembly 100 is used in a mobile phone, the processing circuitry of chip 20 processes the electrical sense signals produced by chip 2 to determine, for example, when a user has moved the phone in proximity to the user's face, when the user has made a gesture with a hand or finger relative to the mobile device, or when the phone is within a particular distance from the user's face. Such determinations may be made in order to perform power management in the mobile device. For example, if the processing circuitry determines that the user has moved a hand or finger in proximity to the mobile device, the processing circuitry may cause the phone to be powered on, or changed from a lower power mode (e.g., a power-saving mode) to a higher power mode (e.g., an active mode). For example, in the power-saving mode, the display and/or keyboard of the mobile device may be unlit to save power, whereas in the higher-power mode the display and/or keyboard may be lit or turned on to visually aid the user.

One of the advantages of the eWLP wafer-level processes described herein is that they may be used to make very thin, or flat, optoelectronic devices that may be incorporated into useful devices and systems in which space utilization is of great concern. Consumer electronic devices such as mobile phones, laptop computers, notebook computers, and tablets incorporate ever-increasing types of functionality without increasing their sizes. In most cases, attempts are being made to decrease the sizes of such devices, particularly in thickness, even as additional functionality is being added to the devices. With current processes for making optoelectronic devices, it is difficult or impossible to make devices with thicknesses of less than about 700 to 800 micrometers (microns). With the eWLP wafer-level processes described herein, optoelectronic devices such as the eWLP package 60 shown in FIG. 3 can easily be made with a thickness or flatness that is less than 700 microns measured as the distance between the top surface of layer 52 and the bottom surface of layer 43.

Furthermore, no additional housing is needed for the eWLP packages due to the fact that they have their own molded encapsulation, which also helps to keep the form factor of the eWLP optoelectronic assemblies very small. The thickness of the eWLP package is essentially the thickness of the eWLP wafer 40, which is limited only by eWLP wafer-level processing technology. Also, because the need for bond wires is eliminated, the eWLP packages can be made thinner than known eWLP packages that include bond wires. It should be noted, however, that the eWLP packages and assemblies of the invention are not limited to having any particular dimensions.

It can be seen from FIG. 3 that the eWLP assembly 100 has an optical interface and an electrical interface with the PCB 70 that are on the same side of the eWLP package 60. If desired or needed, electrical contact between the PCB 70 and the back side of the eWLB package 60 and any electrical contacts (not shown) located on the back sides of the chips 2 and 30 may be made via conductive pathways made up of one or more of the following: contact elements 61 and 71, the bulk material of block 10, the bulk material of chip 20, the metal layer 42, and the back side interconnect elements 5 and 35. As indicated above, the bulk material of the block 10 has an electrical conductivity that is sufficiently high to allow it to be used as an electrical pathway. The bulk material of chip 20 may also have an electrical conductivity that is sufficiently high to allow it to be used as an electrical pathway. The bulk material may be, for example n-doped (e.g., Phosphorus-doped) silicon. In addition, further processing of the eWLP package 60 can be performed to form a redistribution layer in the metal layer 42 to further facilitate electrically interfacing the chips 2, 20 and 30 to each other and/or to other devices (not shown). The manner in which such redistribution layers may be formed is well known and therefore will not be further described herein in the interest of brevity.

Figure 4A:
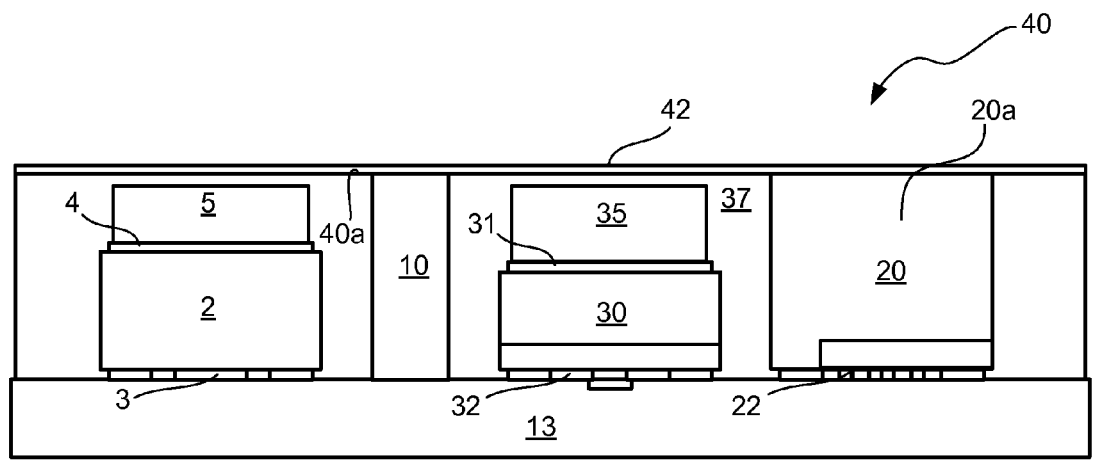
FIG. 4A illustrates a cross-sectional view of the eWLP wafer shown in FIG. 2G without the dielectric material layer shown in FIG. 2G.
Figure 4B:
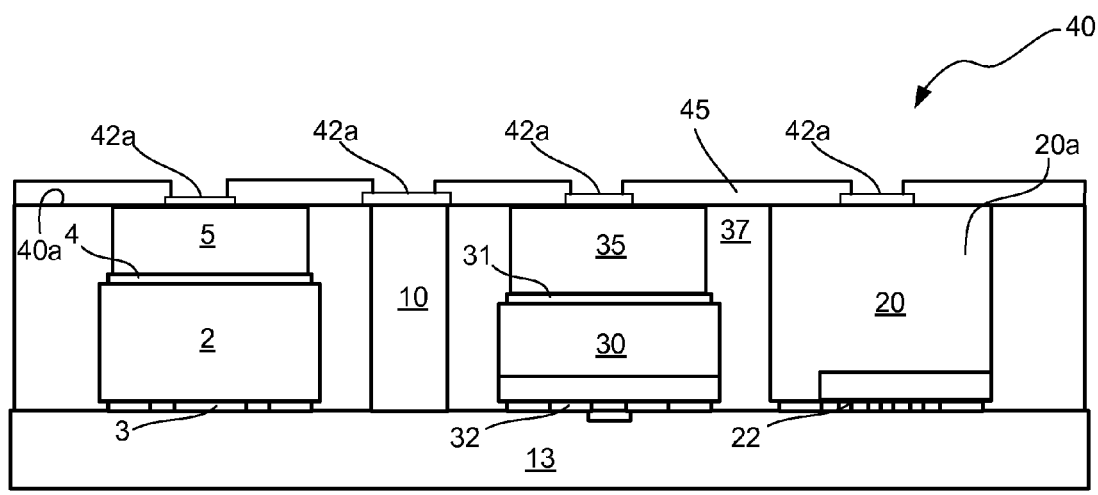
FIG. 4B illustrates a cross-sectional view of the eWLP wafer shown in FIG. 4A after the dielectric material layer and the metal layer have been structured.
Figure 4C:
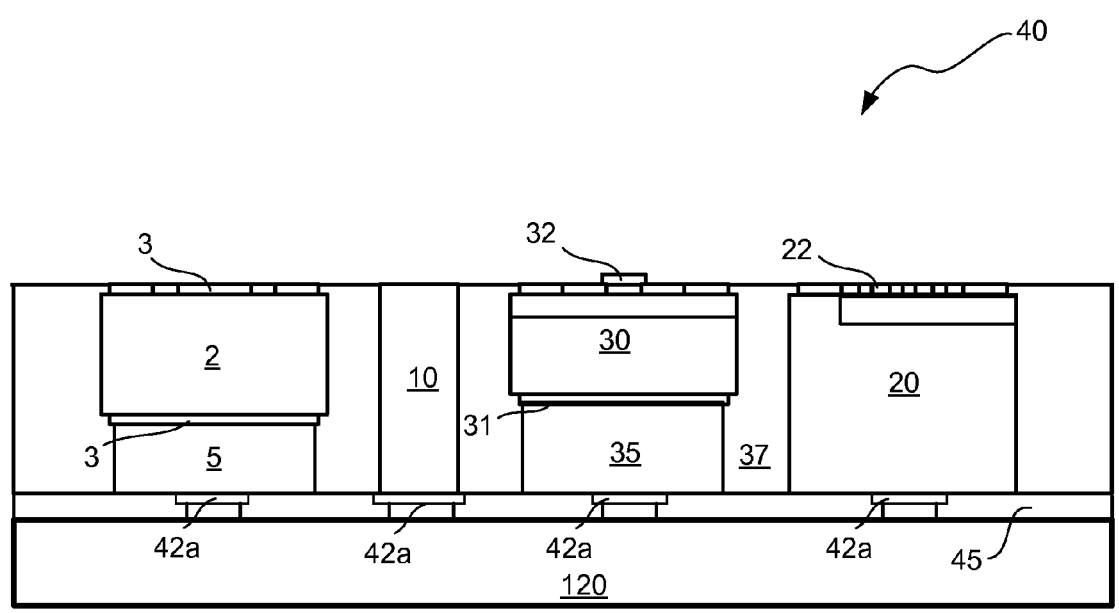
FIG. 4C illustrates a cross-sectional view of the eWLP wafer shown in FIG. 4B after the tape base has been removed and the eWLP wafer has been flipped and placed on another tape base.
Figure 4D:
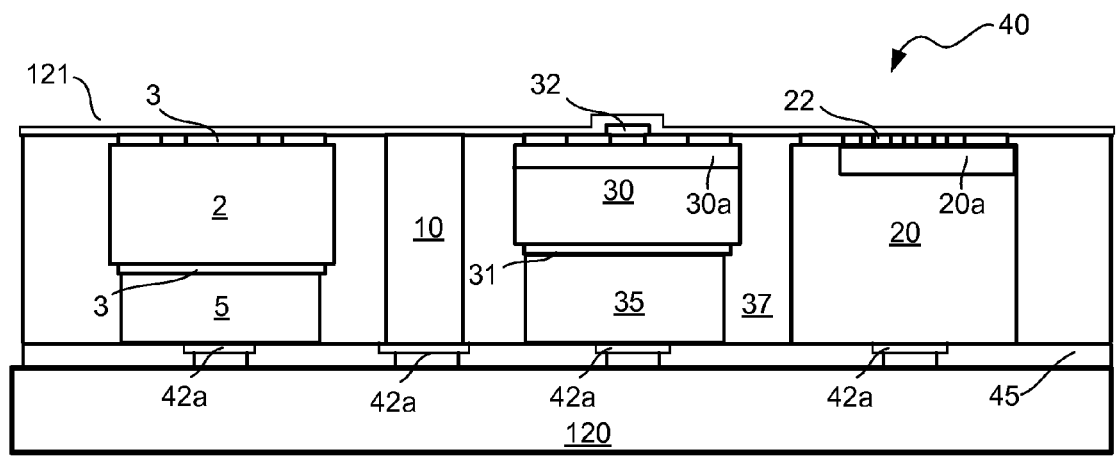
FIG. 4D illustrates a cross-sectional view of the eWLP wafer shown in FIG. 4C after a layer of metal has been deposited on the front side of the eWLP wafer.

The process described above with reference to FIGS. 2G-2N may be altered to create an eWLP assembly having an optical interface on one side of the assembly and an electrical interface on the opposite side of the assembly, as will now be described with reference to FIGS. 4A-4I. FIG. 4A is similar to FIG. 2G, except that the dielectric layer 43 shown in FIG. 2G is missing from FIG. 4A. FIG. 4B illustrates a cross-sectional view of the wafer 40 shown in FIG. 4A after it has been (1) subjected to a photolithographic structuring process to structure the metal layer 42 into contact pads 42a, (2) the contact pads 42a have been covered with a layer of dielectric material 45, and (3) the dielectric material layer 45 has been patterned. FIG. 4C illustrates a cross-sectional view of the wafer 40 after the adhesive tape base 13 has been removed, the wafer 40 has been flipped and the back side of the wafer 40 has been placed in contact with another adhesive tape base 120 such that the patterned dielectric layer 45 is contact with the adhesive of the tape base 120. The wafer 40 is then subjected to a metal deposition process by which a metal layer 121 is formed on the front side of the wafer 40, as represented by the cross-sectional view shown in FIG. 4D.

Figure 4E:
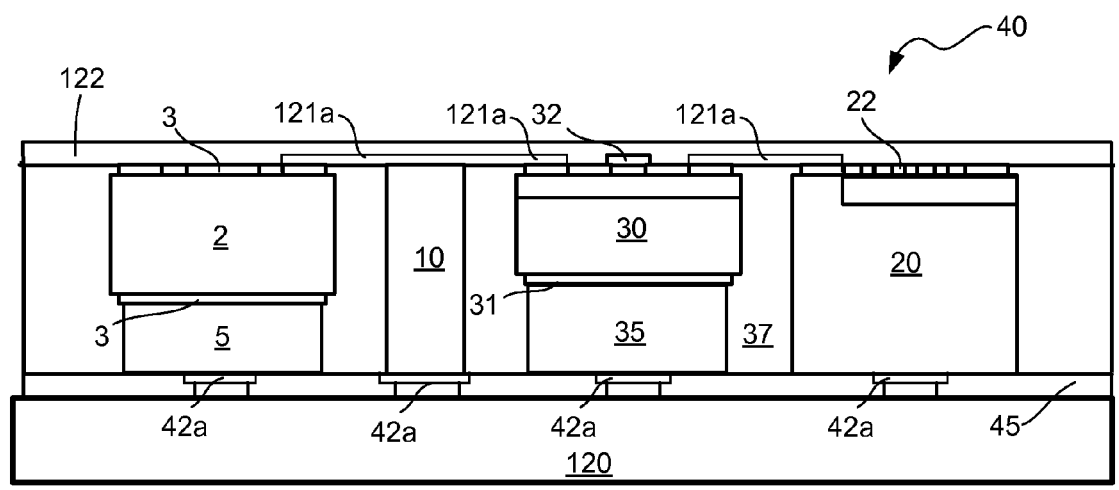
FIG. 4E illustrates a cross-sectional view of the eWLP wafer shown in FIG. 4D after the metal layer has been structured and covered with a layer of dielectric material.
Figure 4F:
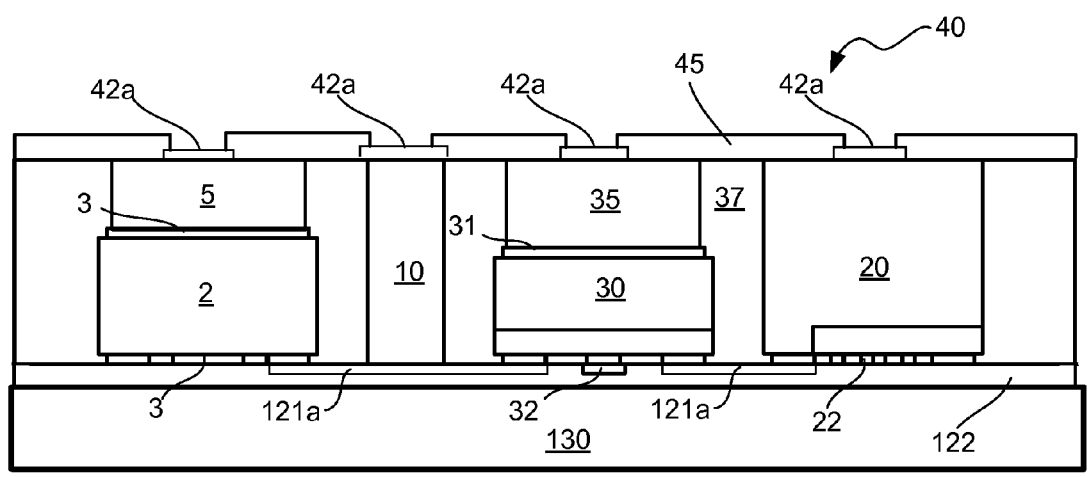
FIG. 4F illustrates a cross-sectional view of the eWLP wafer shown in FIG. 4E after the tape base has been removed and the wafer has been flipped and placed on another tape base.
Figure 4G:
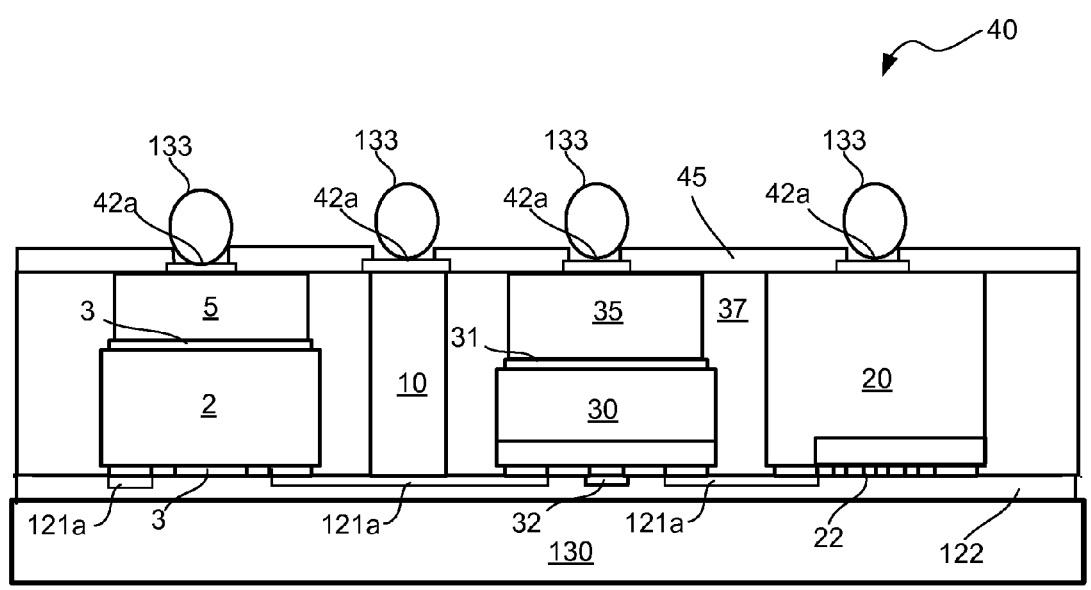
FIG. 4G illustrates a cross-sectional view of the eWLP wafer shown in FIG. 4F after electrically-conductive contact elements have been placed in contact with portions of the structured metal layer disposed on the back side of the wafer.
Figure 4H:
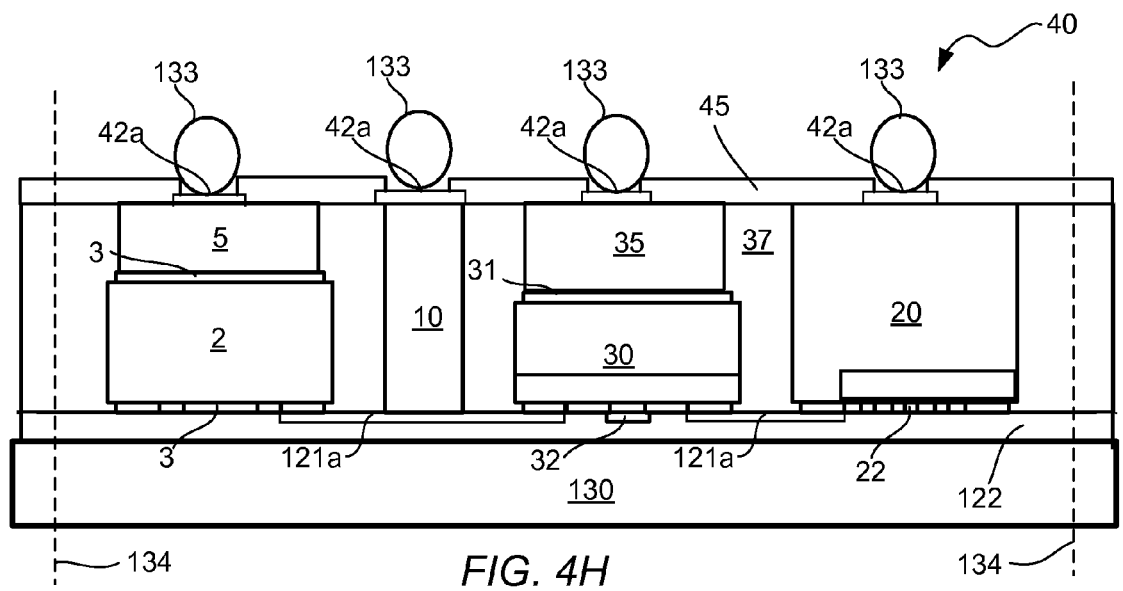
FIG. 4H illustrates a cross-sectional view of the eWLP wafer shown in FIG. 4G after as it is being singulated.

A metal layer structuring, or patterning, process is then performed on the wafer 40 to pattern, or structure, the metal layer 121 to form a structured metal layer 121a on the front side of the wafer 40, which is then covered with a layer of dielectric material 122, as represented by the cross-sectional view of the wafer 40 shown in FIG. 4E. The tape base 120 is then removed from the wafer 40 shown in FIG. 4E and the wafer 40 is flipped and placed on another adhesive tape base 130, as represented by the cross-sectional view of the wafer 40 shown in FIG. 4F. Electrically-conductive contact elements 133 are then placed on the back side of the wafer 40 on the contact pads 42a above the back side interconnect elements 5, 35 and above the top surfaces of the bulk material block 10 and chip 20, as represented by the cross-sectional view of the wafer 40 shown in FIG. 4G. The wafer 40 shown in FIG. 4G is then singulated into multiple eWLP packages, as indicated by the dashed lines 134 in the cross-sectional view of the wafer 40 shown in FIG. 4H. The adhesive tape base 130 is then removed, resulting in the finished eWLP package 140 shown in FIG. 4I.

Figure 4I:
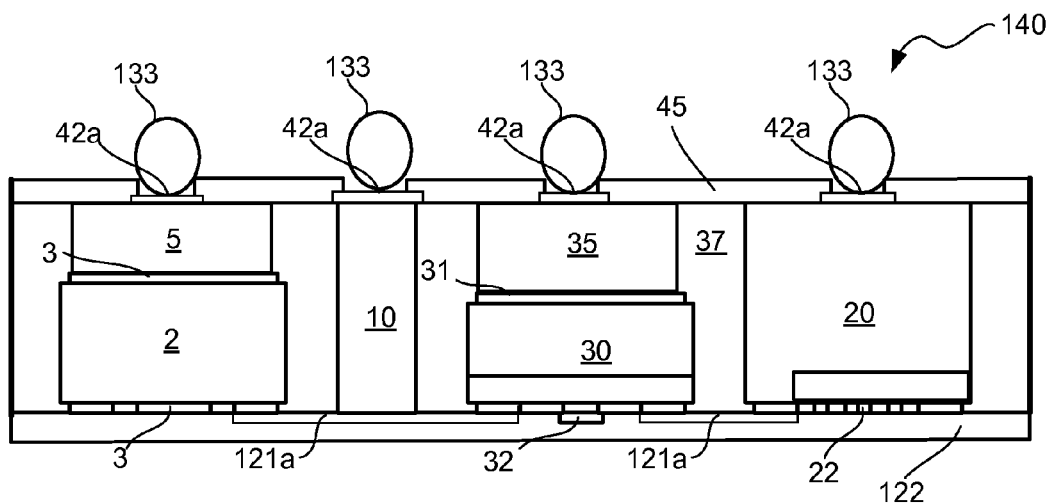
FIG. 4I illustrates a cross-sectional view of the eWLP wafer shown in FIG. 4H after it has been singulated into multiple eWLP packages.
Figure 5:
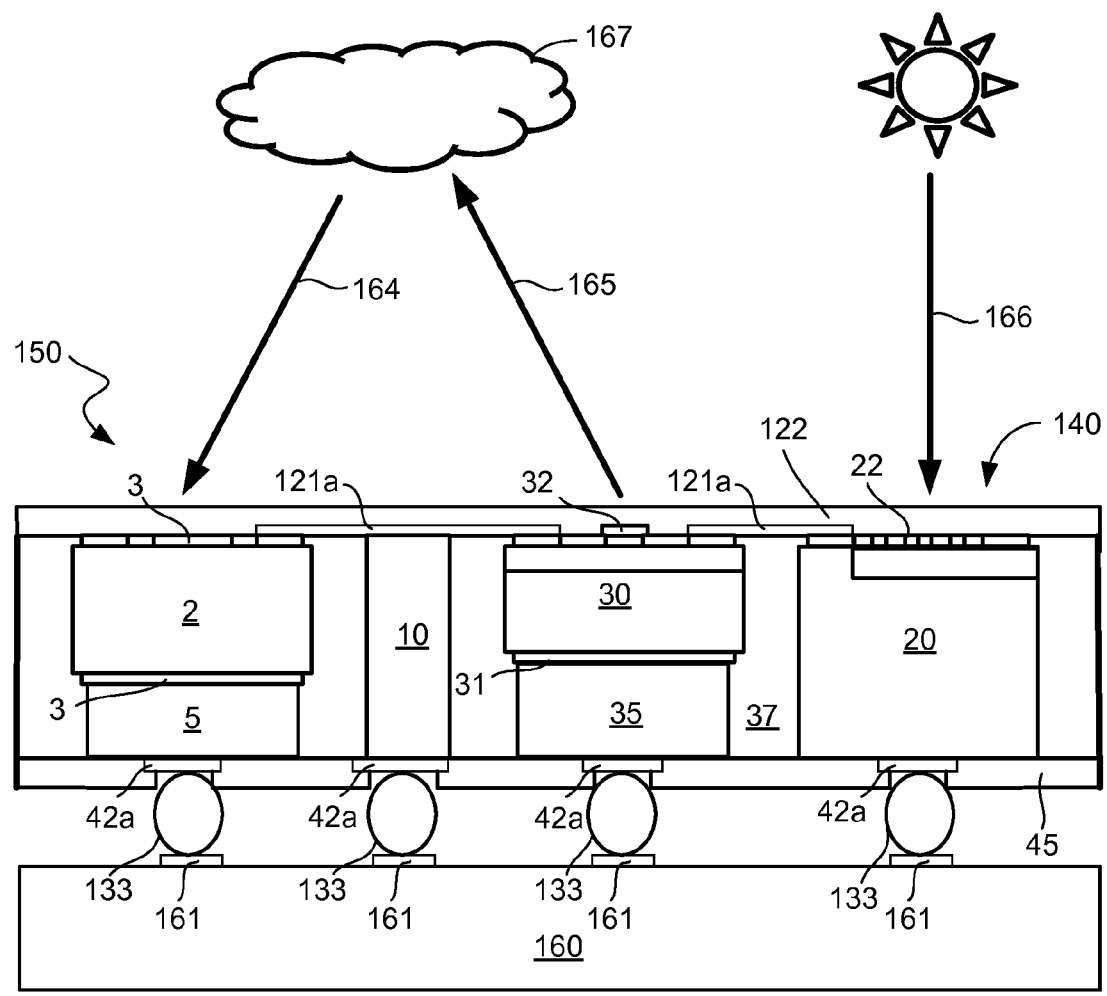
FIG. 5 illustrates a cross-sectional view of an eWLP assembly comprising the eWLP package shown in FIG. 4I flipped and mounted on a PCB.

FIG. 5 illustrates a cross-sectional view of an eWLP assembly 150 comprising the eWLP package 140 shown in FIG. 4I flipped and mounted on a PCB 160 such that the contact elements 133 of the eWLP package 140 are in contact with respective contact elements 161 of the PCB 160. Other mechanisms (not shown) may be used to mechanically couple the PCB 160 with the eWLP package 140 and to provide mechanical stability for the assembly 150. No optical windows are needed in the PCB 160 because the optical interface is on the side of the assembly 150 opposite the PCB 160. In accordance with this illustrative embodiment, the chip 2 is an optoelectronic receiver chip such as, for example, a photodiode chip, the chip 30 is an optoelectronic transmitter chip such as, for example, a laser diode chip, and the chip 20 is also an optoelectronic receiver chip such as, for example, a photodiode chip. In accordance with this illustrative embodiment, the arrows 164 and 166 represent light impinging on chips 2 and 20, respectively, and arrow 165 represents light emitted from the chip 30. One of the chips 2, 20 and 30 may also be a processor or controller chip for processing electrical sense signals produced by chips 2 and 20.

In accordance with an illustrative embodiment, chip 30 emits the same wavelength of light that is detected by chip 2 and at least one of the chips 2, 20 and 30 is a processor chip having processing circuitry (not shown) that processes the electrical sense signals produced by chip 2 to determine the proximity and/or distance of the object 167 relative to the eWLP assembly 150 by performing a Time-of-Flight (ToF) algorithm. The manner in which ToF algorithms are performed to determine the proximity and/or distance of an object relative to an optical receiver based on light that is emitted from an optical transmitter co-located with the optical receiver, reflected off of the object and received by the optical receiver is known. Therefore, the ToF algorithm that is used for this purpose will not be further described herein in the interest of brevity.

The object 167 may be any reflective object. Examples of object 167 are a user's hand, finger, face or ear. An example of an application of the eWLP assembly 150 is its use in a mobile device such as a mobile phone to perform power management. In such an application, the processing circuitry processes the electrical sense signals produced by chip 2 to determine, for example, when a user has moved a hand or a finger in proximity to the mobile phone. When the processing circuitry determines that the user has moved a hand or finger in proximity to the mobile phone, the processing circuitry causes the phone to be powered on, or to be placed in a lower power mode, such as a power-saving mode, or to be placed in a higher power mode in which the display or keyboard of the phone is lit.

In accordance with this illustrative embodiment, the chip 20 is a receiver chip having one or more photosensors, such as photodiodes, that detect ambient light. The photosensors may detect the broad range of wavelengths that make up ambient light, or they may detect red, green and blue (RGB)

light and/or ultraviolet (UV) light. In any of these cases, the processing circuitry processes the electrical sense signals produced by chip 20 to determine the level of ambient light that is being received. When the processing circuitry determines that the ambient light level is above a threshold level, the processing circuitry may, for example, cause the light intensity of a display and/or of a keypad of the mobile device to be increased. When the processing circuitry determines that the ambient light level is below a threshold level, the processing circuitry may, for example, cause the light intensity of a display and/or of a keypad of the mobile device to be decreased.

It can be seen from FIG. 5 that the eWLP assembly 150 has an optical interface at one side of the assembly 150 and an electrical interface with the PCB 160 at the opposite side of the assembly 150. If desired or needed, electrical contact between the PCB 160 and the electrical contacts 3, 22 and 32 located on the front sides of the chips 2, 20 and 30, respectively, may be made by electrically-conductive pathways made up of various combinations of the following: contact elements 161 and 133; the bulk material block 10; the respective metal contact pads 42a; the bulk material of chip 20; and the patterned metal layer 121a. Electrical contact between the PCB 160 and any electrical contacts disposed on the back sides of the chips 2 and 30 are made by the contact elements 161 and 133, the respective contact pads 42a, and the back side interconnect elements 5 or 35. As indicated above, the bulk materials of the block 10 and of chip 20 have electrical conductivities that are sufficiently high to allow them to be used as electrical pathways from the back side of the eWLP package 140 to the front side of the eWLP package 140. This may be accomplished by, for example, using silicon as the bulk material of block 10 and of chip 20 and doping the bulk material with, for example, phosphorus, to increase its electrical conductivity.

Of course, electrical contact between the PCB 160 and the electrical contacts 3, 22 and 32 may be accomplished in other ways. In addition, further processing of the eWLP package 140 can be performed to form a redistribution layer in the patterned metal layer 121a to further facilitate electrically interfacing the contacts 3, 22, and 32 of the chips 2, 20 and 30, respectively, to one another and/or to other devices (not shown).

The semiconductor wafer processes described above with reference to FIGS. 1A-1C and the eWLP artificial wafer processes described above with reference to FIGS. 2A-4I, and variations thereof, may be used to create a number of useful optoelectronic eWLP packages and assemblies that are very thin while making it easier and more cost effective to make electrical connections to the back sides of eWLP packages. Various examples of such assemblies will now be described with reference to FIGS. 6-11.

Figure 6:
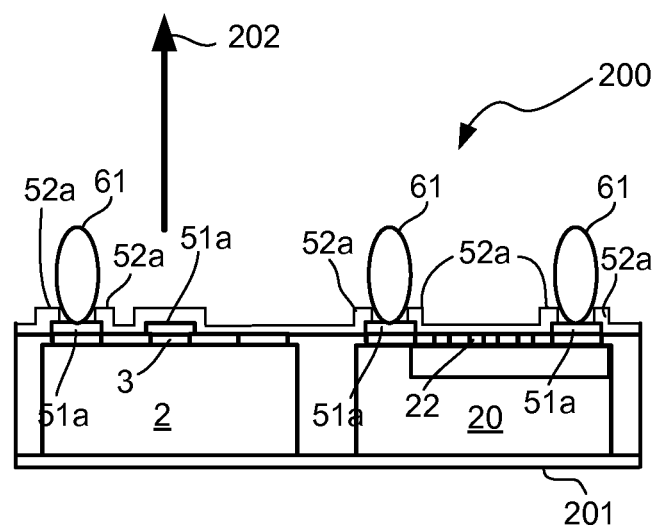
FIG. 6 illustrates a cross-sectional view of an example of an optoelectronic eWLP package in accordance with an illustrative embodiment.

FIG. 6 illustrates a cross-sectional view of an example of an eWLP package 200 that is similar to the eWLP package 60 shown in FIG. 2N except that chip 30, the block of bulk material 10 and the associated elements shown in FIG. 2N have been eliminated. In accordance with this embodiment, the chips 2 and 20 are an LED chip and an LED driver chip, respectively. The package 200 is formed by processes similar to those described above with reference to FIGS. 1A-2N, except that some of those process steps have been skipped. For example, the process steps of adding the metallization layer 4 and the interconnect element 5 have been skipped because they are not needed. The back side of the package 200 has a metal layer 201 thereon that is added during the eWLP wafer-level process after the eWLP wafer has been ground down. The metal layer 201 interconnects electrical contacts (not shown) disposed on the back sides of the chips 2 and 20. Thus, the back side electrical contacts of the chips 2 and 20 are at the same electrical potential. In the bulk material of chip 20, p-type or n-type wells electrically isolate the functional structures 22 of chip 20 from the back side electrical contact of chip 20. The arrow 202 represents light emitted by the LED chip 2.

The configuration shown in FIG. 6 is advantageous because LED chips often have one front side electrical contact and one back side electrical contact. Another advantage of the configuration shown in FIG. 6 is that a heat sink device (not shown) may be secured to the metal layer 201 to allow heat generated by the chips 2 and 20 to be dissipated through the back side of the package 200.

Figure 7:
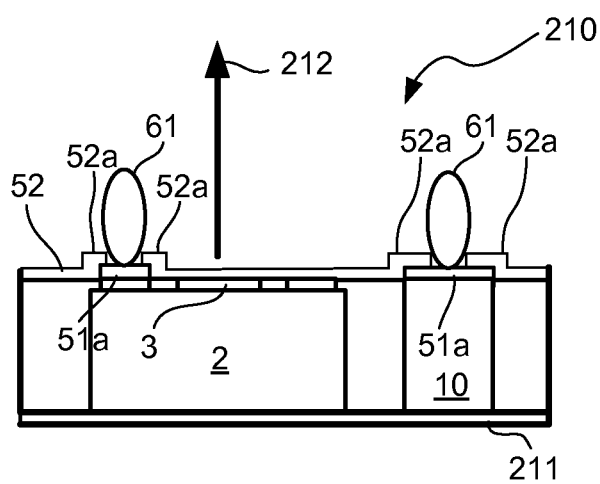
FIG. 7 illustrates a cross-sectional view of an example of an optoelectronic eWLP package in accordance with an illustrative embodiment.

FIG. 7 illustrates a cross-sectional view of an example of an eWLP package 210 that is similar to the eWLP package 60 shown in FIG. 2N except that chips 20 and 30 and the associated elements shown in FIG. 2N have been eliminated. In accordance with this embodiment, the chip 2 is an LED chip driven by external LED driver circuitry (not shown). The package 210 is formed by processes similar to those described above with reference to FIGS. 1A-2N, except that some of those process steps have been skipped. The back side of the package 210 has a metal layer 211 thereon that interconnects electrical contacts (not shown) disposed on the back side of the chip 2 with the bulk material of the block of bulk material 10. The bulk material (e.g., n-doped silicon) of block 10 is sufficiently electrically conductive to conduct enough electrical current to drive the LED chip 2. The external LED driver circuitry is connected to the electrical contact element 61 disposed above the block 10. The block 10 conducts the electrical drive current to the back side of the package 210 into the metal layer 211, which is connected to the back side electrical contact (not shown) of the chip 2. In this way, the external LED driver circuitry drives the LED chip 2. The arrow 212 represents light emitted by the LED chip 2.

As with the eWLP package 200 shown in FIG. 6, the eWLP package 210 shown in FIG. 7 allows an electrical connection to be easily and economically made to the back side electrical contact of the LED chip 2. As with the package 200 shown in FIG. 6, a heat sink device (not shown) may be secured to the metal layer 211 of the package 210 to allow heat generated by the chip 2 and block 10 to be dissipated through the back side of the package 210.

Figure 8:
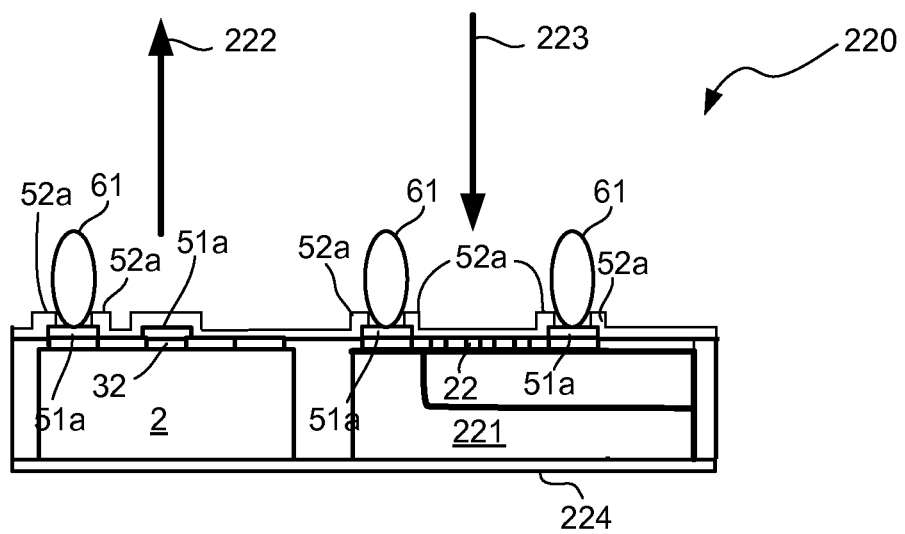
FIG. 8 illustrates a cross-sectional view of an example of an optoelectronic eWLP package in accordance with an illustrative embodiment.

FIG. 8 illustrates a cross-sectional view of an example of an eWLP package 220 that is similar to the eWLP package 200 shown in FIG. 6 except that chip 20 has been replaced by chip 221, which is a combined LED driver and photodiode chip. Thus, chip 221 is both an optoelectronic receiver chip, including an integrated photodiode and amplifier, and an LED driver chip. The arrow 222 represents light emitted by the LED chip 2. The arrow 223 represents light received by the photodiode/LED driver chip 221. The metal layer 224 disposed on the back side of the package 220 interconnects electrical contacts (not shown) disposed on the back sides of the chips 2 and 221.

As with the eWLP packages 200 and 210 shown in FIGS. 6 and 7, the eWLP package 220 shown in FIG. 8 allows an electrical connection to be easily and economically made to the back side electrical contacts of the LED chip 2 and of the photodiode/LED driver chip 221. As with the packages 200 and 210 shown in FIGS. 6 and 7, a heat sink device (not shown) may be secured to the metal layer 224 of the package 220 to allow heat generated by the chips 2 and 221 to be dissipated through the back side of the package 220.

Figure 9:
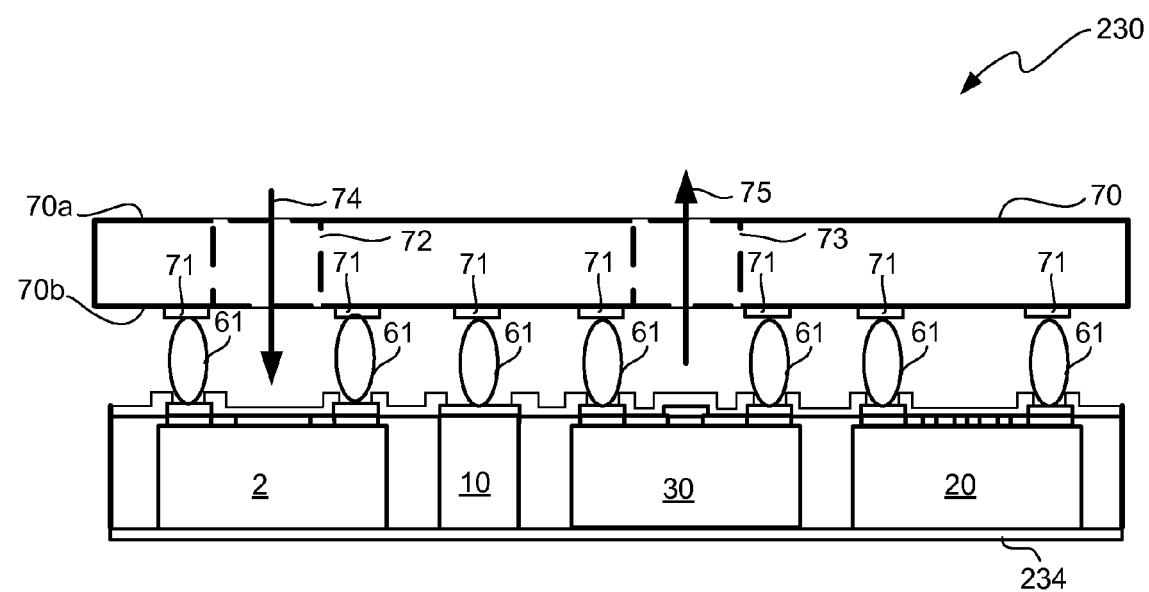
FIG. 9 illustrates a cross-sectional view of an example of an optoelectronic eWLP package in accordance with an illustrative embodiment.

FIG. 9 illustrates a cross-sectional view of an example of an eWLP package 230 that is similar to the eWLP package 100 shown in FIG. 3 except that the interconnect elements 5 and 35 and the metallization layers 4 and 31 are not part of the package 230, either because they were never included or because the back side of the eWLP wafer has been grinded down to the point that they have been eliminated. A metal layer 234 disposed on the back side of the package 230 is in contact with any electrical contacts disposed on the back sides of the chips 2, 20 and/or 30. The bulk materials of block 10 and of chip 20 provide electrically-conductive pathways from the front side of the package 230 to the metal layer 234.

Figure 10:
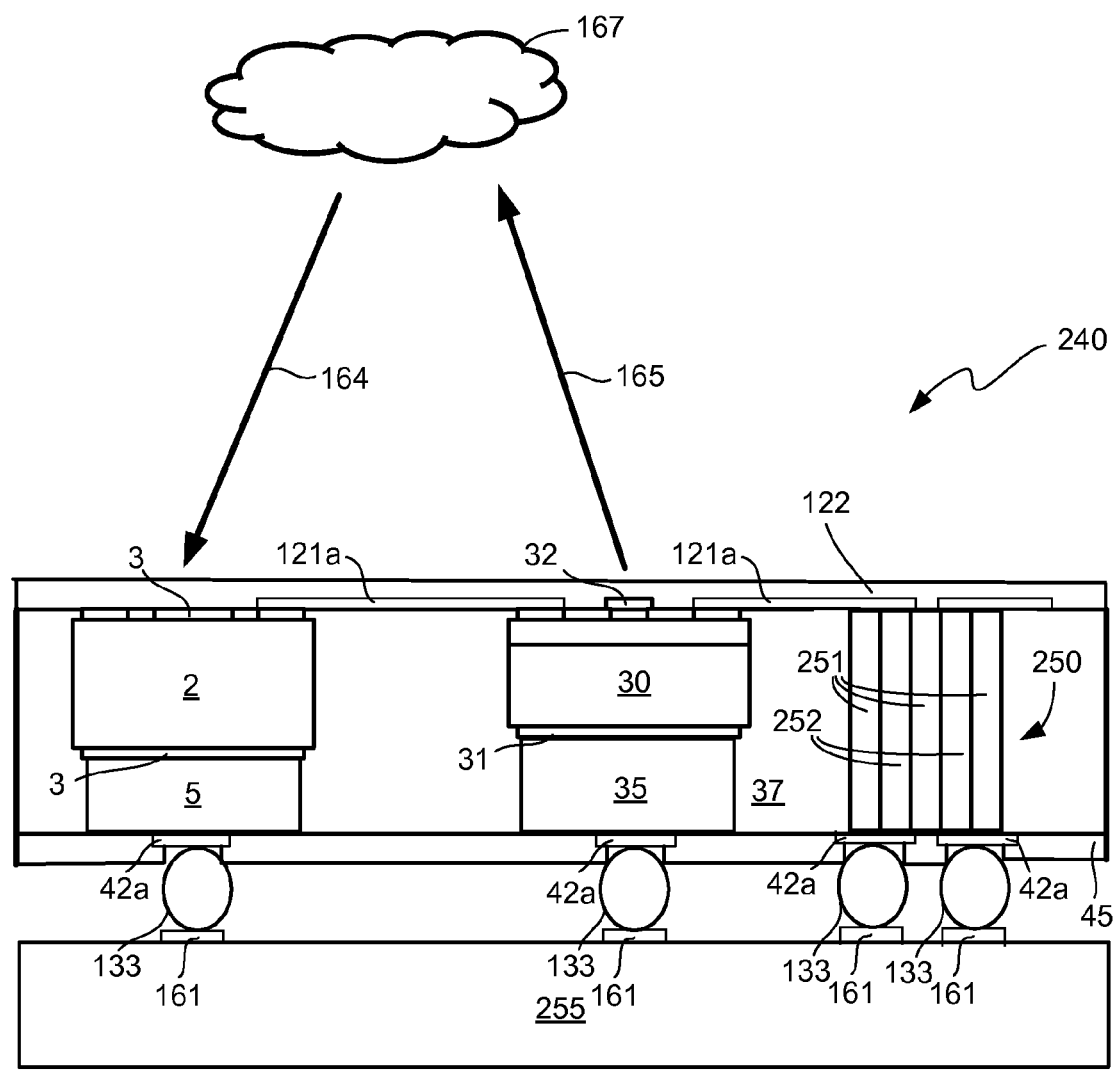
FIG. 10 illustrates a cross-sectional view of an example of an optoelectronic eWLP package in accordance with an illustrative embodiment.

FIG. 10 illustrates a cross-sectional view of an example of an eWLP package 240 that is similar to the eWLP package 140 shown in FIG. 5 except that the block of bulk material 10 has been eliminated and the chip 20 has been replaced by a jumper chip 250 having electrically-isolated vias 251 extending through the bulk material of the chip 250 between the front and back sides of the chip 250. On the front side of the chip 250, the ends of the vias 251 are in contact with the structured metal layer 121a. On the back side of the chip 250, the ends of the vias 251 are in contact with contact pads 42a. The bulk material 252 of the chip 250 that is disposed in between the vias 251 may be constructed of silicon, glass, or any other suitable bulk material used in the TSV arts that is capable of electrically insolating the vias 251 from one another. The electrically-conductive material within the vias 251 may include one or more of copper, gold, aluminum, or any other material of high electrical conductivity. The conductive material may be deposited within the vias 251 using known deposition techniques such as Chemical Vapor Deposition (CVD), Atomic Layer Deposition (ALD), sputtering, photolithography, etc. One or more conductive vias 251 may carry current between a bottom contact pad 42a and the structured metal layer 121a. However, since each conductive via 251 is isolated from all other vias in the jumper chip 250, the different portions of the structured metal layer 121a that are in contact with the vias 251 and the different bottom contact pads 42a that are in contact with the vias 251 can be electrically isolated from one another.

In the illustrative embodiment shown in FIG. 10, the vias 251 conduct electrical current between the PCB 255 and the structured metal layer 121a, which is connected to the functional structures 3 and 32 of the chips 2 and 30, respectively. Electrical current is conducted from the PCB 255 to any electrical contacts disposed on the back sides of the chips 2 and 30 by the respective elements 161, 133, 42a, and 5 or 35. In accordance with this illustrative embodiment, the chip 2 is a receiver chip and the chip 30 is a transmitter chip. The receiver chip 2 comprises an array of photosensors. For example, the array of photosensors may an array of 3-D pixel sensors. Such pixel sensor arrays are known in the art of ToF range finders. Either chip 2 or chip 30 is also a processor chip.

In accordance with this illustrative embodiment, light 165 produced by chip 30 is reflected 164 from the reflective target 167 onto chip 2 and the corresponding electrical sense signals produced by chip 2 are processed by the processing circuitry of the processor chip 2 or 30 to determine the position of the object 167 from the eWLP package 240 in 3-dimensional (3-D) space. The processor chip 2 or 30 performs a ToF algorithm to determine the 3-D position of the object 167 relative to the eWLP package 240. As indicated above, the manner in which ToF algorithms are performed using the electrical sense signals output from an array of 3-D pixel sensors to determine the position of an object in 3-D space is known.

Figure 11:
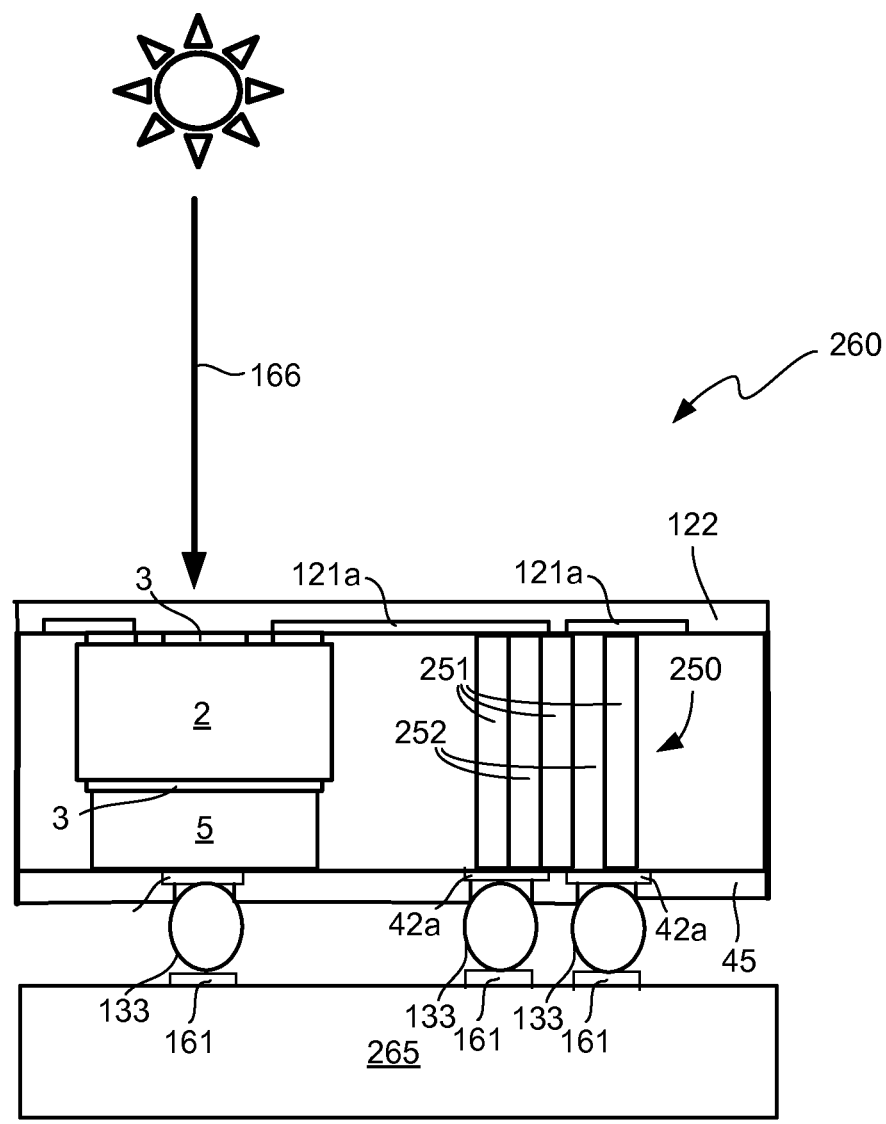
FIG. 11 illustrates a cross-sectional view of an example of an optoelectronic eWLP package in accordance with an illustrative embodiment.

FIG. 11 illustrates a cross-sectional view of an example of an eWLP package 260 that is similar to the eWLP package 240 shown in FIG. 10 except that the chip 30 has been eliminated and chip 2 is detecting the level of intensity of ambient light being received by it. In this illustrative embodiment, the vias 251 conduct electrical current between the PCB 265 and the structured metal layer 121a, which is connected to the functional structures 3 of the chip 2. Electrical current is conducted from the PCB 265 to any electrical contacts disposed on the back side of the chip 2 by the elements 161, 133, 42a, and 5. The receiver chip 2 is a receiver chip cable of sensing ambient light or RGB light. The receiver chip 2 is also a processor chip comprising processing circuitry for processing the electrical sense signals produced by chip 2 to determine the level of intensity of ambient light that is being received by chip 2. For example, the array of photosensors may an array of ambient light sensors that directly measure the level of intensity of ambient light being received by the chip 2. Alternatively, the array of photosensors may an array of RGB light sensors that indirectly measure the level of intensity of ambient light being received by the chip 2. In the latter case, the processing circuitry processes the RGB sense signals to determine the level of intensity of the ambient light based on the amount of RGB light received. Both types of pixel sensor arrays are known in the art.

Not all chips have back side electrical contacts. Therefore, it is not necessary in all cases to provide electrically-conductive pathways from the front side of the eWLP package to the back side of the eWLP package. The above examples demonstrate the manner in which such electrically-conductive pathways can be easily and economically provided at the eWLP wafer level in the event that they are needed or desired. In addition, the above examples demonstrate how such pathways can be provided without having to form TSVs or TMVs in the chips or in the eWLP wafer, respectively. It should be noted that the examples are not exhaustive and that persons of skill in the art will understand, in view of the description being provided herein, the manner in which the principles and concepts described herein can be applied to create other types of eWLP devices, packages and assemblies.

With reference again to FIGS. 10 and 11, the jumper chip 250 has been described as comprising an electrically-isolating bulk material 252 having electrically-conductive vias 251 formed therein for interconnecting the structured metal layer 121a disposed on the front side of the packages 240, 260 with the contact pads 42a disposed on the back side of the packages 240, 260. Thus, the jumper chip 250 essentially acts as an electrical interconnection between the electrical interface on the front side of the chip 250 and the electrical interface on the back side of the chip 250. Other types of bulk material 252 and via material 251 can be used for the chip 250 to provide an optical interface between the front side of the packages 240, 260 and the back sides of the packages 240, 260.

For example, using a bulk material 252 for the chip 250 that is opaque to an operational wavelength of light and a via material 251 that is transparent to the operational wavelength of light causes the vias 251 to act as optical interconnects, or light pipes, to pass light of the operational wavelength between the front and back sides of the packages 240, 260. Similarly, using a bulk material 252 for the chip 250 that is thermally non-conductive and a via material 251 that is thermally conductive causes the vias 251 to act as thermal interconnects, or heat pipes, that pass heat between the front and back sides of the packages 240, 260. The thermal and optical vias can be intermixed in the chip 250 to allow the chip to perform the thermal and optical interconnect functions. For the thermal and optical vias, the ends of the vias do not need to be in contact with the structured metal layer 121 or with the contact pads 42a, and thus the portions of the structured metal layer 121 and the contact pads 42a adjacent the ends of the vias 251 can be eliminated.

It should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. For example, the invention has been described with respect to examples of particular configurations of eWLP devices, packages and assemblies made using methods of the invention, but the invention is not limited with respect to the particular configurations of the eWLP devices, packages and assemblies. The invention also is not limited to the particular sequences of process steps described above with reference to the figures. Persons of skill in the art will understand that many variations can be made to the illustrative embodiments without deviating from the scope of the invention.

What is claimed is:

1. An embedded Wafer-Level Packaging (eWLP) method comprising:
    forming an eWLP artificial wafer comprising a plurality of components partially encapsulated within a hard molded compound, wherein front sides of the components are outside of the hard molded compound and disposed on a front side of the eWLP artificial wafer, the components including an integrated circuit (IC) chip of a first type, the IC chip of the first type having at least a first electrical contact element disposed on the front side thereof and at least a second electrical contact element disposed on a back side thereof, the second electrical contact element being electrically coupled with a first electrically-conductive back side interconnect element, a portion of the interconnect element being outside of the hard molded compound and disposed on a back side of the eWLP artificial wafer;
    forming an electrical interface on either the front side or the back side of the eWLP artificial wafer; and
    dicing the eWLP wafer into a plurality of eWLP packages, each eWLP package including at least one of the IC chips of the first type.

2. The eWLP method of claim 1, wherein the back side interconnect element comprises a semiconductor material that has been doped to increase an electrical conductivity of the semiconductor material.

3. The eWLP method of claim 2, wherein the semiconductor material is n-doped semiconductor material.

4. The eWLP method of claim 3, wherein the semiconductor material is n-doped silicon.

5. The eWLP method of claim 1, wherein the components further include an IC chip of a second type that is different from the first type, the IC chip of the second type having at least a first electrical contact element disposed on the front side thereof, and wherein each eWLP package includes at least one of the IC chips of the second type.

6. The eWLP method of claim 5, wherein a back side of each IC chip of the second type is outside of the hard molded compound and is disposed on the back side of the eWLP artificial wafer, and wherein a bulk material of the IC chip of the second type provides an electrically-conductive pathway between the front side of the eWLP wafer and the back side of the eWLP wafer.

7. The eWLP method of claim 6, wherein the back side of each IC chip of the second type has at least a second electrical contact element thereon, and wherein one or more p-type or n-type wells formed in the bulk material electrically isolate the first electrical contact element disposed on the front side of the IC chip of the second type from the second electrical contact element disposed on the back side of the IC chip of the second type.

8. The eWLP method of claim 5, wherein a back side of the IC chip of the second type has a second electrical contact element thereon, the second electrical contact element disposed on the back side of the IC chip of the second type being electrically coupled with a second electrically-conductive back side interconnect element, a portion of the second interconnect element being outside of the hard molded compound and disposed on the back side of the eWLP artificial wafer.

9. The eWLP method of claim 1, wherein the components further include a block of bulk material having a front side that is outside of the hard molded compound and is disposed on the front side of the eWLP artificial wafer and having a back side that is outside of the hard molded compound and is disposed on the back side of the eWLP artificial wafer, and wherein the bulk material provides an electrically-conductive pathway between the front side of the eWLP wafer and the back side of the eWLP wafer, and wherein each eWLP package includes at least one of the blocks of bulk material.

10. The eWLP method of claim 1, wherein the components further include an IC chip of a second type that is different from the first type, the IC chip of the second type having one or more vias formed therein that extend from a front side of the chip of the second type to a back side of the chip of the second type, and wherein each eWLP package includes at least one of the IC chips of the second type.

11. The eWLP method of claim 10, wherein the vias comprise electrically-conductive material and wherein a bulk material of the IC chip of the second type electrically isolates the vias from one another.

12. The eWLP method of claim 10, wherein the vias comprise thermally-conductive material and wherein a bulk material of the IC chip of the second type thermally isolates the vias from one another.

13. The eWLP method of claim 10, wherein the vias comprise material that is transparent to at least one wavelength of light, and wherein a bulk material of the IC chip of the second type is opaque to said at least one wavelength of light.

14. An embedded Wafer-Level Packaging (eWLP) assembly comprising:
    an eWLP package diced from an eWLP artificial wafer, the eWLP package comprising at least an integrated circuit (IC) chip of a first type partially encapsulated within a hard molded compound of the eWLP package, the IC chip of the first type having at least a first electrical contact element disposed on a front side thereof and at least a second electrical contact element disposed on a back side thereof, the second electrical contact element being electrically coupled with a first electrically-conductive back side interconnect element, a portion of the interconnect element being outside of the hard molded compound and disposed on a back side of the eWLP package, the first electrical contact element being outside of the hard molded compound and disposed on a front side of the eWLP package;

an electrical interface on either the front side or the back side of the eWLP package; and a carrier on which the eWLP package is mounted, the carrier having an electrical interface that is interfaced with the electrical interface of the eWLP package.

15. The eWLP assembly of claim 14, wherein the back side interconnect element comprises a semiconductor material that has been doped to increase an electrical conductivity of the semiconductor material.

16. The eWLP assembly of claim 15, wherein the semiconductor material is n-doped semiconductor material.

17. The eWLP assembly of claim 16, wherein the semiconductor material is n-doped silicon.

18. The eWLP assembly of claim 14, wherein the components further include an IC chip of a second type that is different from the first type, the IC chip of the second type having at least a first electrical contact element disposed on the front side thereof, and wherein each eWLP package includes at least one of the IC chips of the second type.

19. The eWLP assembly of claim 18, wherein a back side of each IC chip of the second type is outside of the hard molded compound and is disposed on the back side of the eWLP artificial wafer, and wherein a bulk material of the IC chip of the second type provides an electrically-conductive pathway between the front side of the eWLP wafer and the back side of the eWLP wafer.

20. The eWLP assembly of claim 19, wherein the back side of each IC chip of the second type has at least a second electrical contact element thereon, and wherein one or more p-type or n-type wells formed in the bulk material electrically isolate the first electrical contact element disposed on the front side of the IC chip of the second type from the second electrical contact element disposed on the back side of the IC chip of the second type.

21. The eWLP assembly of claim 18, wherein a back side of the IC chip of the second type has a second electrical contact element thereon, the second electrical contact element disposed on the back side of the IC chip of the second type being electrically coupled with a second electrically-conductive back side interconnect element, a portion of the second interconnect element being outside of the hard molded compound and disposed on the back side of the eWLP artificial wafer.

22. The eWLP assembly of claim 14, wherein the components further include a block of bulk material having a front side that is outside of the hard molded compound and is disposed on the front side of the eWLP artificial wafer and having a back side that is outside of the hard molded compound and is disposed on the back side of the eWLP artificial wafer, and wherein the bulk material provides an electrically-conductive pathway between the front side of the eWLP wafer and the back side of the eWLP wafer, and wherein each eWLP package includes at least one of the blocks of bulk material.

23. The eWLP assembly of claim 18, wherein the components further include an IC chip of a third type that is different from the first and second types, the IC chip of the third type having at least a first electrical contact element disposed on the front side thereof, and wherein each eWLP package includes at least one of the IC chips of the third type.

24. The eWLP assembly of claim 14, wherein the IC chip of the first type is a receiver chip comprising one or more photosensors for sensing ambient light, and wherein the IC chip is also a processor chip that processes electrical sense signals produced by said one or more photosensors to determine a level of ambient light being sensed by said one or more photosensors.

25. The eWLP assembly of claim 18, wherein the IC chips of the first and second types are optoelectronic receiver and transmitter IC chips, respectively, and wherein the transmitter IC chip emits light of a particular wavelength or range of wavelengths, and wherein the receiver IC chip detects light of said particular wavelength or range of wavelengths reflected from a reflective object, and wherein at least one of the IC chips is also a processor IP chip comprising processing circuitry for processing electrical sense signals produced by the receiver IC chip to determine at least one of a proximity of the eWLP assembly to the object, a distance of the eWLP assembly from the object, a gesture made by the object, and a spatial position of the object in 3-dimensional (3-D) space.

26. The eWLP assembly of claim 23, wherein the IC chips of the first and second types are optoelectronic receiver and transmitter IC chips, respectively, and the IC chip of the third type is a processor IP chip comprising processing circuitry, and wherein the transmitter IC chip emits light of a particular wavelength or range of wavelengths, and wherein the receiver IC chip detects light of said particular wavelength or range of wavelengths reflected from a reflective object, and wherein the processing circuitry of the processor chip processes electrical sense signals produced by the receiver IC chip to determine at least one of a proximity of the eWLP assembly to the object, a distance of the eWLP assembly from the object, a gesture made by the object, and a spatial position of the object in 3-dimensional (3-D) space.

27. The eWLP assembly of claim 23, wherein the IC chips of the first, second and third types are a first optoelectronic receiver IC chip, an optoelectronic transmitter IC chip, and a second optoelectronic receiver IC chip, respectively, and wherein the transmitter IC chip emits light of a particular wavelength or range of wavelengths, and wherein the first receiver IC chip detects light of said particular wavelength or range of wavelengths reflected from a reflective object, and wherein the second receiver IC chip senses ambient light, and wherein at least one of the IC chips is also a processor chip comprises processing circuitry that processes electrical sense signals produced by the second receiver chip to determine a level of ambient light being sensed by the second receiver IC chip.

28. The eWLP assembly of claim 27, and wherein the processing circuitry processes electrical sense signals produced by the first receiver IC chip to determine at least one of a proximity of the eWLP assembly to the object, a distance of the eWLP assembly from the object, a gesture made by the object, and a spatial position of the object in 3-dimensional (3-D) space.

29. The eWLP assembly of claim 14, wherein the carrier is a circuit board having electrical conductors formed therein and having one or more electrical contacts disposed on a surface thereof, said one or more electrical contacts disposed on the surface of the circuit board electrically interfacing with said at least a first electrical contact element of the IC chip of the first type.

30. The eWLP assembly of claim 14, wherein the carrier is a transparent substrate having electrical conductors disposed therein and having one or more electrical contacts disposed on a surface thereof, said one or more electrical contacts disposed on the surface of the substrate electrically interfacing with said at least a first electrical contact element of the IC chip of the first type.

31. An embedded Wafer-Level Packaging (eWLP) method comprising:

forming an eWLP artificial wafer comprising having a front side, a back side, and a plurality of interconnect elements extending between the front side and the back side of the eWLP artificial wafer, each interconnect element having a first end disposed on a front side of the eWLP artificial wafer outside of the wafer and having a second end disposed on a back side of the eWLP artificial wafer outside of the wafer, each interconnect element comprising a semiconductor material that has been doped to increase an electrical conductivity of the semiconductor material such that the interconnect element acts as an electrical interconnect between the front side of the eWLP artificial wafer and the back side of the eWLP artificial wafer.

* * * * *